(12) United States Patent
Hashimoto et al.

(10) Patent No.: US 7,981,817 B2
(45) Date of Patent: Jul. 19, 2011

(54) METHOD FOR MANUFACTURING SEMICONDUCTOR DEVICE USING MULTIPLE ION IMPLANTATION MASKS

(75) Inventors: Koichi Hashimoto, Hyogo (JP); Shin Hashimoto, Osaka (JP); Kyoko Egashira, Kyoto (JP)

(73) Assignee: Panasonic Corporation, Osaka (JP)

( * ) Notice: Subject to any disclaimer, the term of this patent is extended or adjusted under 35 U.S.C. 154(b) by 41 days.

(21) Appl. No.: 12/523,073

(22) PCT Filed: Aug. 31, 2007

(86) PCT No.: PCT/JP2007/067011
§ 371 (c)(1),
(2), (4) Date: Jul. 14, 2009

(87) PCT Pub. No.: WO2008/087763
PCT Pub. Date: Jul. 24, 2008

(65) Prior Publication Data
US 2010/0048004 A1 Feb. 25, 2010

(30) Foreign Application Priority Data
Jan. 16, 2007 (JP) .................... 2007-006804

(51) Int. Cl.
*H01L 21/265* (2006.01)
(52) U.S. Cl. ........ 438/942; 438/943; 438/945; 438/951; 438/270; 438/532; 257/341; 257/E21.334; 257/E21.603
(58) Field of Classification Search ............. 438/519, 438/942–951, 270, 259, 448, 449, 532, 634, 438/646; 257/E21.334–E21.346, E21.473, 257/E21.603, E21.605, 341
See application file for complete search history.

(56) References Cited

U.S. PATENT DOCUMENTS

| 5,874,338 A | 2/1999 | Ferla et al. |
| 6,054,352 A | 4/2000 | Ueno |
| 6,117,735 A | 9/2000 | Ueno |

(Continued)

FOREIGN PATENT DOCUMENTS

FR 2 767 964 3/1999

(Continued)

OTHER PUBLICATIONS

International Search Report for corresponding application No. PCT/JP2007/067011 mailed Dec. 4, 2007.

(Continued)

*Primary Examiner* — Hsien-ming Lee
*Assistant Examiner* — Walter H Swanson
(74) *Attorney, Agent, or Firm* — Renner, Otto, Boisselle & Sklar, LLP

(57) ABSTRACT

A production method for a semiconductor device includes providing a semiconductor substrate having semiconductor layer of a first conductivity type formed on a surface thereof; forming a first mask so as to cover a predetermined region of the semiconductor layer; (c) forming a well region of a second conductivity type by implanting impurity ions of the second conductivity type into the semiconductor layer having the first mask formed thereon; reducing the thickness of the first mask by removing a portion of the first mask; forming a second mask covering a portion of the well region by using photolithography; and forming a source region of the first conductivity type by implanting impurity ions of the first conductivity type into the semiconductor layer having the first mask with the reduced thickness and the second mask formed thereon.

13 Claims, 11 Drawing Sheets

U.S. PATENT DOCUMENTS

| | | |
|---|---|---|
| 6,359,318 B1 | 3/2002 | Yamamoto et al. |
| 7,157,342 B1 * | 1/2007 | Tarabbia et al. ............. 438/303 |
| 2003/0127694 A1 | 7/2003 | Morton et al. |

FOREIGN PATENT DOCUMENTS

| | | |
|---|---|---|
| JP | 64-010672 | 1/1989 |
| JP | 01-189174 | 7/1989 |
| JP | 02-086136 | 3/1990 |
| JP | 07-221295 | 8/1995 |
| JP | 08-017848 | 1/1996 |
| JP | 10-233503 | 9/1998 |
| JP | 2000-077532 | 3/2000 |
| JP | 2001-168210 | 6/2001 |
| JP | 2002-299620 | 10/2002 |
| JP | 2005-353877 | 12/2005 |
| JP | 2006-237116 | 9/2006 |
| JP | 2006-303272 | 11/2006 |

OTHER PUBLICATIONS

Form PCT/ISA/237 and a partial English translation, Mailed: Dec. 4, 2007.

Japanese Office Action for corresponding Application No. 2008-553951 and English translation, Mailed: Jun. 30, 2009.

* cited by examiner (a)

(b)

(c)

(d)

(e)

(a)

(b)

(c)

(d)

(e)

(f)

(g)

(h)

(i)

(j)

(k)

US 7,981,817 B2

METHOD FOR MANUFACTURING SEMICONDUCTOR DEVICE USING MULTIPLE ION IMPLANTATION MASKS

TECHNICAL FIELD

The present invention relates to a semiconductor device and a method for producing the same.

BACKGROUND ART

Semiconductor elements (power devices) which have a high breakdown voltage and allow a large current to flow therethrough are used in various fields. Conventionally, Si power devices in which silicon (Si) semiconductor is used have been in the mainstream. However, Si power devices have limited use due to the physical properties of Si semiconductor. In recent years, SiC power devices in which silicon carbide (SiC) semiconductor is used, which is a semiconductor material having a larger band gap (wide-band gap) than that of Si semiconductor, are being developed.

SiC semiconductor has higher breakdown voltage characteristics than those of Si semiconductor. Therefore, in a vertical power MOSFET in which SiC semiconductor is used, the drift region can be made thin, and also the impurity density in the drift region can be increased, thus making it possible to greatly reduce the drift resistance. Moreover, since SiC semiconductor has excellent heat conduction characteristics and high-temperature durability, the current-carrying capacity of an SiC power MOSFET can be easily improved.

However, while the drift resistance can be greatly reduced, an SiC power MOSFET has a problem of large channel resistance, which prevents its ON resistance from being sufficiently reduced. The reason why an SiC power MOSFET has a large channel resistance is described below.

In an SiC power MOSFET, generally speaking, a gate insulating layer ($SiO_2$) is formed by performing a thermal oxidation treatment for the surface of an SiC layer. At the interface of the $SiO_2$ layer thus formed and the SiC layer, interface states that trap a large number of carriers are formed with a high density. Therefore, when a channel is formed in these interfaces, the high-density interface states will decrease the carrier mobility (channel mobility) at the channel, thus increasing the channel resistance.

In order to reduce the channel resistance of a MOSFET, it is necessary to reduce the gate length (channel length) and reduce the cell pitch to enhance the degree of integration of unit cells.

Patent Document 1 discloses a method of utilizing a self-aligning process to form a source region within a well region, with a view to improving the channel resistance. According to this method, the gate length can be reduced, so that losses due to channel resistance can be suppressed.

FIGS. 10(a) to (c) are step-by-step cross-sectional views for describing a method of forming a source region according to a self-aligning process which is disclosed in Patent Document 1. Note that an MOSFET is typically constructed from a large number of unit cells which are arranged on a substrate, each unit cell being defined by a well region. FIGS. 10(a) to (c) only show portions of adjoining unit cells, among such unit cells.

First, as shown in FIG. 10(a), on an SiC layer 2 which is grown on a substrate (not shown), an $SiO_2$ layer 24 is formed. Thereafter, by using this as a mask, impurity ions (conductivity type: e.g. p type) are implanted into the SiC layer 2. As a result, a plurality of well regions 6 are formed in the SiC layer 2, and the regions of the SiC layer 2 where the well regions 6 have not been formed become a drift region 2a.

Then, as shown in FIG. 10(b), sidewalls (sidewall spacers) 25, which are in contact with the lateral walls of the $SiO_2$ layer 24, and a resist layer 23 covering portions of the well regions 6 are formed. Specifically, an $SiO_2$ film (not shown) is deposited on the substrate surface on which the $SiO_2$ layer 24 is formed; by etching this back, the sidewalls 25 are obtained in a self-aligning manner. Next, a resist film (not shown) is deposited on the substrate surface, and thereafter is patterned through exposure and development, whereby the resist layer 23 is formed. As shown by dotted lines, in a portion 7' of each well region 6 that is covered with the resist layer 23, a well contact region is formed in a subsequent step, which is a high-concentration p type region.

Next, as shown in FIG. 10(c), by using the $SiO_2$ layer 24, the sidewalls 25, and the resist layer 23 as a mask, impurity ions (conductivity type: e.g. n type) are implanted into the SiC layer 2, thus obtaining source regions 8. The distance Lg between the end of a well region 6 and the end of a source region 8 on the surface of the SiC layer 2 defines the "gate length" of the MOSFET. The gate length Lg is determined by the width of the sidewalls 25. The width of the sidewalls 25 is controlled by the thickness of the $SiO_2$ layer 24 for forming the sidewalls 25. Moreover, since the sidewalls 25 are formed through a self-aligning process which does not require mask alignment, variations in the gate length Lg due to misalignment of the mask are prevented, unlike in earlier processes. Therefore, as compared to earlier processes, the gate length Lg can be made substantially uniform.

Note that, at this step, impurity ions are not implanted into the portions 7' to become the well contact regions, because they are covered with the resist layer 23. After the implantation, the $SiO_2$ layer 24, the sidewalls 25, and the resist layer 23 having been used as a mask are removed.

Thereafter, by implanting impurity ions (conductivity type: e.g. p type) at a high concentration into the portion 7' of each well region 6 that has been covered with the resist layer 23, a well contact region is obtained. Since n type impurity ions are not implanted into the portion 7' to become the well contact region in the aforementioned step of forming the source regions 8, but only p type impurity ions are implanted in this step at a high concentration, a higher-concentration p type well contact region can be formed.

The well contact regions are provided for the following reasons. Generally speaking, in a power MOSFET, a source electrode to be formed on the SiC layer 2 needs to not only form an ohmic contact with a source region 8, but also form an ohmic contact with a well region 6 in order to fix the potential of the well region 6 to a reference potential. However, a semiconductor having a large band gap such as SiC is not likely to form a good ohmic contact. In order for a good ohmic contact to be formed, it is preferable to increase the impurity concentration in a portion of the surface of the well region 6 that joins the source electrode. Thus, a construction is employed where a high-concentration p type region (well contact region) is provided in the well region 6 to form a good ohmic contact between the well contact region and the source electrode.

According to the method described above with reference to FIG. 10, the sidewalls 25 are formed through a self-aligning process, which ensures that the gate length Lg is substantially uniform and short. Therefore, while minimizing deteriorations in the device characteristics due to variations in the gate length Lg (short channel effect), the channel resistance can be reduced.

[Patent Document 1] Japanese Laid-Open Patent Publication No. 2002-299620

DISCLOSURE OF INVENTION

Problems to be Solved by the Invention

However, according to a study by the inventors, in the method disclosed in Patent Document 1, the implantation mask 24 for forming the well regions is thick, and therefore the patterning precision for the resist layer 23 for protecting the portions 7' to become the well contact regions will become low in a photolithography step which is performed after the ion implantation for forming the well regions 6. Thus, a problem has been found in that, even though the gate length may be reduced, it is difficult to sufficiently increase the degree of integration of unit cells.

This problem will be described in detail below, with reference to FIGS. 11(a) to (e). For simplicity, constituent elements which are similar to those in FIGS. 10(a) to (c) will be denoted by like reference numerals, and the descriptions thereof will be omitted.

In the method disclosed in Patent Document 1, firstly, as shown in FIG. 11(a), p type well regions 6 are formed by using an $SiO_2$ layer 24 to implant a p type impurity into an n type SiC layer 2 which has been grown on a substrate (not shown).

Herein, generally speaking, the well regions 6 are designed so as to have a depth d of 0.4 μm or more, in order to suppress a punch-through between the source and the drain. Since thermal diffusion of impurities is very unlikely to occur in SiC, in order to form such deep well regions 6, it is necessary to perform an impurity implantation with an energy as high as 300 keV, for example. At this time, the thickness t of the $SiO_2$ layer 24 to be used as an implantation mask is designed to be 1.2 μm or more, for example. The thickness t of the implantation mask is to be appropriately selected according to the impurity species and implantation energy of the ion implantation and the material of the implantation mask, so that the implanted ions will not enter into SiC through this implantation mask. A poly-Si layer may be used as an implantation mask, in which case the thickness t of the implantation mask is approximately equal to the thickness of the case where an $SiO_2$ layer is used.

Next, on the SiC layer 2, an $SiO_2$ film is deposited so as to cover the $SiO_2$ layer 24, and thereafter the $SiO_2$ film is subjected to an anisotropic dry etching. As a result, sidewalls 25 are formed as shown in FIG. 11(b).

Next, as shown in FIG. 11(c), a positive type resist film 23a is applied so as to cover the substrate surface. In order to form a resist film 23a covering the entire substrate surface, the thickness $h_1$ of the resist film 23 in portions located above the well regions 6 must be greater than the thickness t of the $SiO_2$ layer 24, as shown in the figure. The resultant resist film 23 is thicker above the well regions 6 than above the $SiO_2$ layer 24. Specifically, the thickness $h_1$ of the portions of the resist film 23a located above the well regions 6 is greater than the thickness $h_2$ of the portion located above the $SiO_2$ layer 24 by a difference corresponding to the thickness t of the $SiO_2$ layer 24.

Thereafter, as shown in FIG. 11(d), the resist film 23a is patterned through a known exposure and development step, whereby the resist layer 23 is formed so as to cover the portions of the well regions 6 where well contact regions are to be formed.

In this exposure step, an exposure mask (not shown) that shades the regions of the resist film 23a where the resist layer 23 is to be formed is used. However, since the thickness $h_1$ of the resist film 23a becomes large due to the $SiO_2$ layer 24 being thick as described above, it is difficult to achieve focusing in the entire range along the thickness direction of the resist film 23a, thus leaving portions which are not sufficiently exposed. Therefore, when a development step is performed after exposure, as shown in the figure, any portion 28 of the resist film 23a that has not been sufficiently exposed will remain unremoved. In the present specification, the portions 28 which remain unremoved due to insufficient exposure will be referred to as "development residues". Thus, the resultant pattern of the resist layer 23 becomes larger than the pattern that is defined by the exposure mask, by a difference corresponding to the development residues 28.

Next, as shown in FIG. 11(e), n type impurity ions are implanted into the SiC layer 2 by using the $SiO_2$ layer 24, the sidewalls 25, and the resist layer 23 as an implantation mask, thereby obtaining source regions 8 inside the well regions 6.

In this implantation step, the development residues 28 also function as part of the implantation mask. Therefore, as shown in the figure, each resultant source region 8 has a slope 8' in a portion under the development residue 28, and any portion that lacks sufficient depth will fail to obtain a good ohmic property in a subsequent step of forming source electrodes (not shown). The width Ws of the source region 8 is smaller than a design width Ws' that is defined by the aforementioned exposure mask. In order to ensure a sufficient contact area, it is necessary to increase the design width Ws of the source region 8, in view of a deviation from the design value due to the development residue 28. However, the size of each unit cell will increase as the design width Ws increases, thus resulting in a lower degree of cell integration and an increased ON resistance of the MOSFET. As used herein, a "degree of cell integration" refers to the number of cells included per unit area.

Thus, according to the method disclosed in Patent Document 1, it is impossible to form a high-resolution resist pattern in a photolithography step which is performed after forming the well regions 6. Development residues are particularly likely to occur when the resist film 23 is thick because of the $SiO_2$ layer 24 being thick, or when the width for developing such a thick resist film 23, i.e., the width Ws of each source region 8, is small.

Therefore, when an MOSFET is fabricated by using the method disclosed in Patent Document 1, the size of each unit cell composing the MOSFET cannot be sufficiently miniaturized, and the degree of integration of unit cells cannot be enhanced. The channel resistance of an MOSFET can be reduced by shortening the gate length Lg or enhancing the unit cell integration. However, with the method of Patent Document 1, a channel resistance reducing effect due to shortening of the gate length Lg may be obtained, but a channel resistance reducing effect due to enhancement of unit cell integration will not be obtained, and therefore it is difficult to achieve a great reduction in the ON resistance of the MOSFET.

The present invention has been made in view of the above circumstances, and an objective thereof is to improve the controllability of a photolithography which is performed after an ion implantation for forming well regions, thus realizing an enhancement of unit cell integration and providing a semiconductor device whose ON resistance is effectively reduced.

Means for Solving the Problems

A production method for a semiconductor device according to the present invention comprises the steps of: (a) providing a semiconductor substrate having a semiconductor layer of a first conductivity type formed on a surface thereof; (b) forming a first mask so as to cover a predetermined region of the semiconductor layer; (c) forming a well region of a second conductivity type by implanting impurity ions of the second conductivity type into the semiconductor layer having the first mask formed thereon; (d) reducing the thickness of the first mask by removing a portion of the first mask; (e) forming a second mask covering a portion of the well region by using photolithography; and (f) forming a source region of the first conductivity type by implanting impurity ions of the first conductivity type into the semiconductor layer having the first mask with the reduced thickness and the second mask formed thereon.

In a preferred embodiment, between step (d) and step (e) is further comprised a step (h) of forming a sidewall formation film covering the first mask with the reduced thickness, wherein, step (e) includes a step (e1) of forming on the sidewall formation film a resist layer covering a portion of the well region, and a step (e2) of etching the sidewall formation film and the resist layer to form the second mask and the sidewall from the sidewall formation film; and step (f) is a step of forming the source region of the first conductivity type by implanting impurity ions of the first conductivity type into the semiconductor layer on which the second mask, the first mask with the reduced thickness, and the sidewall are formed.

In a preferred embodiment, between step (d) and step (e) are comprised a step (g1) of forming a sidewall formation film covering the first mask with the reduced thickness, and a step (g2) of forming the sidewall by etching back the sidewall formation film, wherein, step (f) is a step of forming the source region of the first conductivity type by implanting impurity ions of the first conductivity type into the semiconductor layer on which the second mask, the first mask with the reduced thickness, and the sidewall are formed.

In a preferred embodiment, the first mask has a multilayer structure including a plurality of layers; and step (d) includes a step (d1) of reducing the thickness of the first mask by removing at least one layer from the uppermost of the multilayer structure.

The multilayer structure may have at least two layers containing respectively different materials, and step (d1) may include a step of removing an upper layer of the at least two layers.

The at least two layers may be a layer containing silicon dioxide and a layer containing polycrystalline silicon.

Between step (a) and step (b), a step of forming an etch-stop layer on the semiconductor layer may be further comprised, wherein, in step (b), the first mask may be formed on the etch-stop layer.

The etch-stop layer may contain silicon dioxide and the first mask may contain polycrystalline silicon.

Between step (a) and step (h), a step of forming an etch-stop layer on the semiconductor layer may be further comprised, wherein, in step (h), the sidewall formation film may be formed on the etch-stop layer.

The etch-stop layer may contain silicon dioxide and the sidewall formation film may contain polycrystalline silicon.

Preferably, the first mask with the reduced thickness and the sidewall formation film contain a same material.

Preferably, the first mask has a thickness of 0.8 µm or more.

Preferably, the thickness of the first mask with the reduced thickness is 0.8 µm or less.

Preferably, the thickness of the first mask with the reduced thickness is equal to or greater than a thickness of the sidewall formation film.

The semiconductor layer may contain silicon carbide.

EFFECTS OF THE INVENTION

With a production method for a semiconductor device according to the present invention, the controllability of a photolithography which is performed after formation of well regions can be improved. Therefore, when a transistor having a plurality of unit cells is fabricated by using this method, it is possible to enhance the degree of integration of unit cells through miniaturization of the well regions, whereby the ON resistance of the transistor can be reduced.

Moreover, by applying a self-aligning process for forming a channel, the gate length can be greatly reduced and the degree of integration of unit cells can be enhanced, which will be particularly advantageous. Furthermore, in the case where an implantation mask for protecting the well contact regions (high-concentration impurity region) is formed by utilizing photolithography after forming the well regions, such an implantation mask can be formed with a high precision. Therefore, the well regions can be miniaturized while ensuring good well contacts. Thus, the following three are realized at the same time: (1) obtainment of good well contacts; (2) reduction of the gate length; and (3) improvement of the degree of integration of unit cells. Therefore, the ON resistance of the transistor can be reduced more effectively.

DESCRIPTION OF REFERENCE NUMERALS

Figure 1:
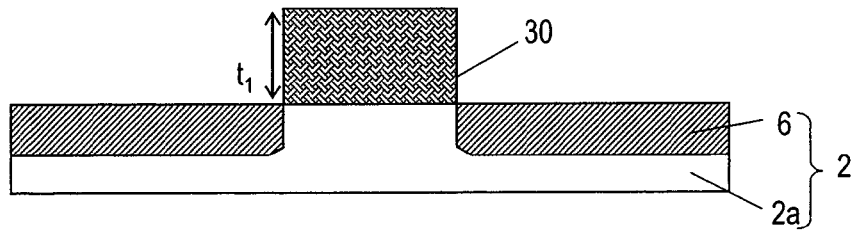
FIG. 1 (a) to (e) are schematic step-by-step cross-sectional views for describing a method of forming well regions and source regions according to an embodiment of the present invention.
Figure 1:
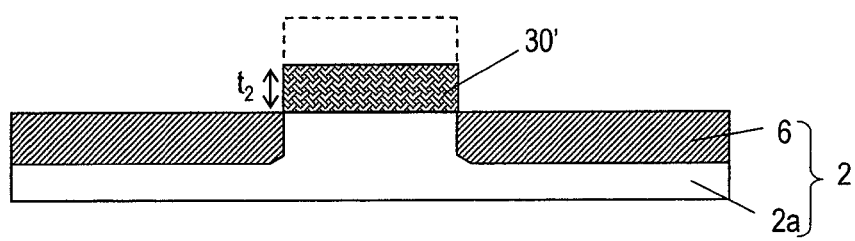
Figure 1:
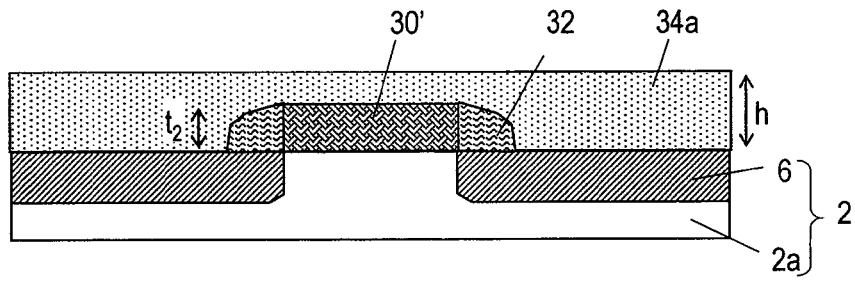
Figure 1:
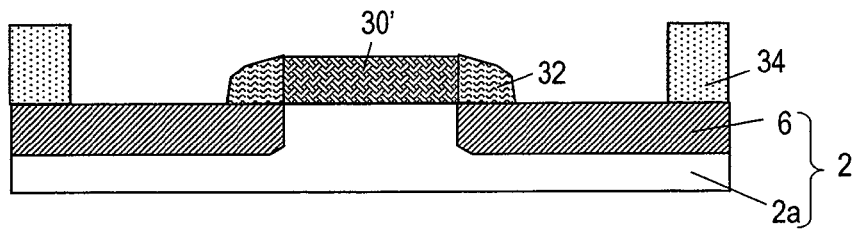
Figure 1:
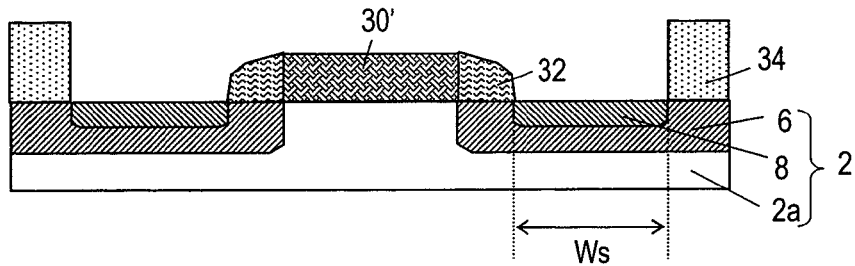

1 SiC substrate
2 SiC layer
2a drift region
4 gate insulating film
5 drain electrode
6 well region
7 well contact region
8 source region
9 channel region
10 source electrode
11 gate electrode
15 interlayer insulating film
17 upper wiring
24, 30, 50, 70, 110, 130 implantation mask for forming well regions
30', 50', 70', 110', 130' mask with reduced thickness
56, 126, 136 sidewall formation film
25, 32, 56a, 126a, 136a sidewall
23a, 34a, 58a resist film
58 resist layer
23, 34, 56b, 126b, 136b mask
60 implantation mask for forming well contact regions
80, 81 thin-film layer (etch-stop layer)
100, 200 unit cell

BEST MODE FOR CARRYING OUT THE INVENTION

Hereinafter, with reference to the drawings, the outline of a production method for a semiconductor device according to the present invention will be described. FIGS. 1(a) to (e) are schematic step-by-step cross-sectional views for describing a step of forming well regions and source regions according to a preferable embodiment of the present invention. For simplicity, constituent elements which are similar to those in FIGS. 11(a) to (e) will be denoted by like reference numerals, and the descriptions thereof will be omitted.

First, as shown in FIG. 1(a), by using a mask 30 as an implantation mask, an impurity is selectively implanted into a semiconductor layer (which herein is an SiC layer) 2 that is formed on a semiconductor substrate (not shown), thereby forming well regions 6. The thickness $t_1$ of the mask 30 is 1.5 μm, for example.

Next, as shown in FIG. 1(b), the thickness of the mask 30 is reduced by etching or the like, thus obtaining a mask 30' which is thinner than the mask 30. The thickness $t_2$ of the mask 30' is 0.8 μm, for example.

Next, as shown in FIG. 1(c), a sidewall formation film (not shown) such as a poly-Si film is deposited so as to cover the mask 30', and an etch back is performed to form sidewalls 32 on lateral walls of the mask 30'. Thereafter, a resist film 34a is applied so as to cover the substrate surface.

In the present embodiment, since the thickness of the mask 30' is reduced, level differences of the face on which the resist is applied are kept small. Therefore, the resist film 34a can be made thinner than the resist film 23a shown in FIG. 11(c) described above. The thickness h of the resist film 34a only needs to be larger than the thickness $t_2$ of the mask 30', e.g. 2.2 μm.

Figure 11:
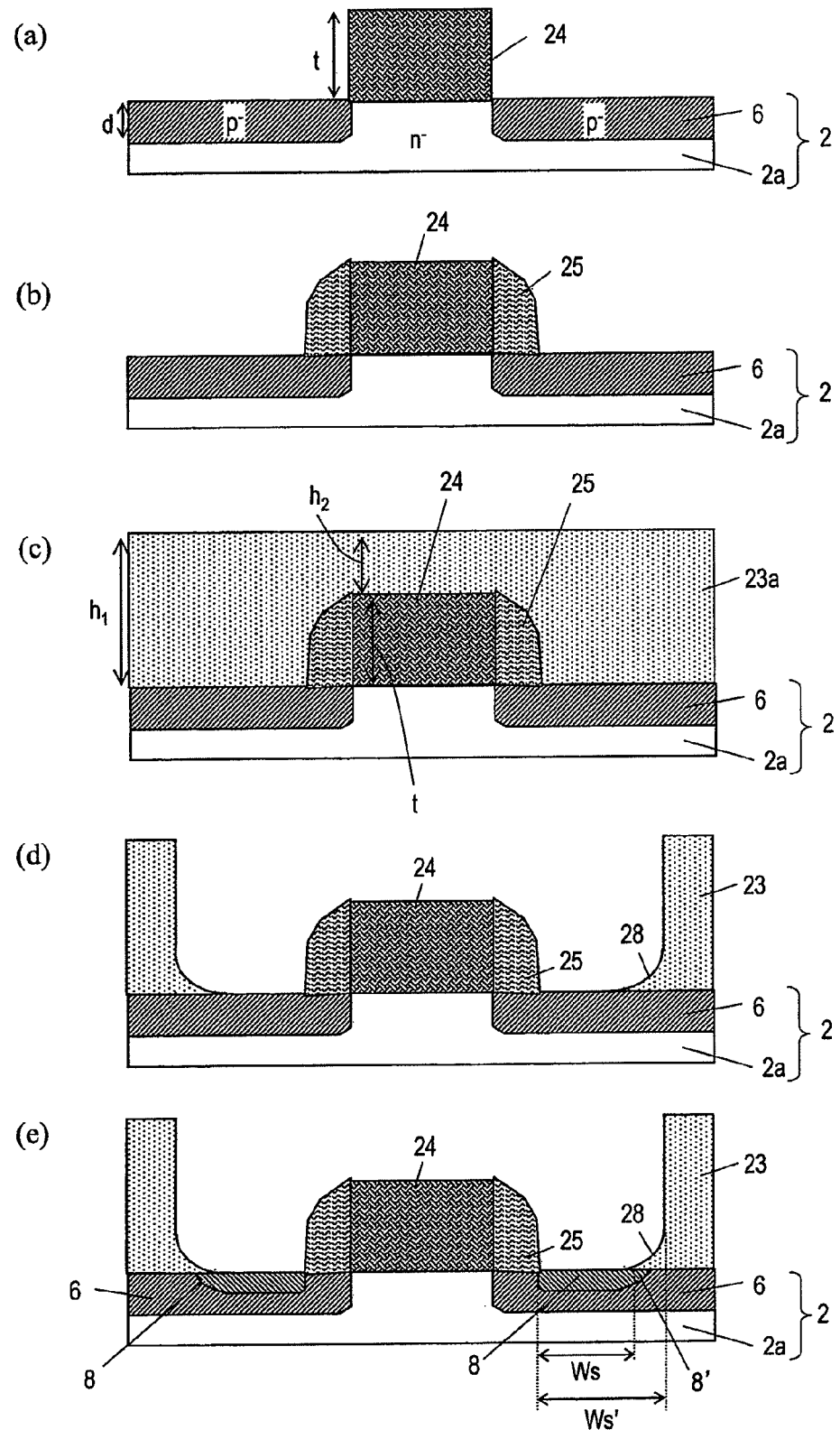
FIG. 11 (a) to (e) are step-by-step cross-sectional views for describing problems of the conventional method illustrated in FIG. 10.

Thereafter, as shown in FIG. 1(d), by a known exposure-development step using an i-line stepper, for example, the resist film 34a is patterned, thus obtaining a mask (hereinafter also referred to as a "mask for protecting the well contact regions") 34 that covers portions of the well regions 6 to become well contact regions. In the present embodiment, since the thickness h of the resist film 34a is kept small, any insufficient exposure as described with reference to FIG. 11(d) does not occur, so that the "development residues" as shown in FIG. 11(d) are suppressed even in the case where the width Ws of the source regions 8 is as small as about 1.8 μm or less. Therefore, a mask 34 having a high-resolution pattern corresponding to the shape of an exposure mask (not shown) is obtained.

Next, as shown in FIG. 1(e), by using the mask 30', the sidewalls 32, and the mask 34 as an implantation mask, an impurity is implanted into the SiC layer 2, thereby forming the source regions 8. The width Ws of each resultant source region 8 is substantially equal to a design width which is defined by the aforementioned exposure mask, and has a shape which does not have any slope as shown in FIG. 11(e).

Thus, according to the above method, "development residues" are suppressed in a photolithography step which is performed after formation of the well regions 6, and therefore the mask 34 functioning as an implantation mask for formation of the source regions can be formed with a high precision. As a result, it is possible to suppress an increase in contact resistance due to the source regions 8 having slopes and the width Ws of the source regions 8 deviating from the design value. Moreover, since the gate length Lg is defined in a self-aligning manner by the sidewalls 32 which are formed via etch back, the gate length Lg can be made substantially uniform and short, whereby the channel resistance can be reduced.

When an MOSFET composed of a plurality of unit cells is fabricated by applying the above method, there is no need to provide large process margins in consideration of development residues from the resist pattern, and thus the cell size can be reduced, whereby an enhancement of the unit cell integration is realized. Therefore, the channel integration density can be improved, so that the channel resistance of the entire MOSFET can be reduced, whereby the ON resistance of the MOSFET can be kept low.

Note that, as in the embodiment described later, after forming a film for sidewall formation but before performing an etch back, formation and patterning of a resist film may be performed. In that case, the mask for protecting the well contact regions will be composed of the sidewall formation film, instead of the resist film.

Although the mask 30 is composed of a single layer in the above method, it may have a multilayer structure including a plurality of layers. In that case, the mask 30' having a smaller thickness than that of the mask 30 may be formed by removing at least one layer from the uppermost of the layers composing the mask 30.

Moreover, in the above method, depending on the materials of the mask 30 and the sidewalls 32, the surface of the semiconductor layer 2 may be eroded while forming them through patterning. In order to prevent this, an etch-stop layer may be provided on the surface of the semiconductor layer 2 as necessary.

For example, in the case where an SiC layer is used as the semiconductor layer 2 and the mask 30 is formed thereupon by using poly-Si, there is a low etching selectivity between the mask 30 and the semiconductor layer 2, and the surface of the SiC layer may be eroded when performing the patterning for forming the mask 30. Therefore, a thin-film layer (e.g. an $SiO_2$ layer) may be formed on the semiconductor layer 2 before forming the mask 30 with which to form the well regions, and the mask 30 may be formed on this thin-film layer. As a result, the thin-film layer functions as an etch-stop layer (also referred to as an "etch-stop layer for mask formation") during the patterning for forming the mask 30, whereby the surface of the semiconductor layer 2 can be protected.

On the other hand, when an SiC layer is used as the semiconductor layer 2, for example, and a poly-Si film is formed thereon as a sidewall formation film, the surface of the SiC layer may be eroded when an etch back is performed for the sidewall formation film. Therefore, before forming the sidewall formation film, a thin-film layer (e.g. an $SiO_2$ layer) may be formed on the semiconductor layer 2, and the sidewall formation film may be formed on the thin-film layer. As a result, when forming the sidewalls by etching the sidewall formation film, the thin-film layer functions as an etch-stop layer (also referred to as an "etch-stop layer for sidewall formation"), whereby the surface of the semiconductor layer 2 can be protected.

Thus, by providing an etch-stop layer, it becomes possible to prevent the semiconductor layer 2 from being eroded when forming the mask 30 and the sidewalls 32 and to prevent the surface of the semiconductor layer 2 from being damaged, so that increases in channel resistance and contact resistance due to roughening of the surface of the semiconductor layer 2 can be suppressed.

Note that both an etch-stop layer for mask formation and an etch-stop layer for sidewall formation may be provided, or either one of them may be provided. Alternatively, neither one may be provided, as in the method shown in FIG. 1. These etch-stop layers are to be provided as necessary according to the film to be etched and the material and etching method of the semiconductor layer 2, and the materials of the etch-stop layers are to be appropriately selected according to the film to be etched and the material and etching method of the semiconductor layer 2. Typically, in an etching step for forming the mask 30, the etch-stop layer material is to be selected so that the etch-stop layer for mask formation has a smaller etching rate than that of the mask 30 (or when the mask 30 has a multilayer structure, the lower layers thereof). As for the etch-stop layer for sidewall formation, similarly, the material of the etch-stop layer is to be selected so that it has a smaller etching rate than that of the sidewall formation film in an etching step for forming the sidewalls 32.

Moreover, the same thin-film layer may be allowed to function as an etch-stop layer for mask formation and as an etch-stop layer for sidewall formation. Specifically, a thin-film layer which is formed before forming the mask 30 may be allowed to function as an etch-stop layer for mask formation, and thereafter a sidewall formation film may be formed on this thin-film layer, so that it is utilized as an etch-stop layer for sidewall formation. Such a construction may be suitably adopted in the case where the mask 30 (or when the mask 30 has a multilayer structure, the lower layers thereof) and the sidewalls 32 contain the same material.

In the case where the mask 30 has a multilayer structure and the mask 30' is formed by removing at least one layer from the uppermost of the multilayer structure, it is preferable that the mask (or the lower layers in the multilayer structure) 30' and the sidewall formation film contain the same material. As a result, as described above, it becomes easy to allow the same thin-film layer to function as an etch-stop layer at mask formation and sidewall formation, whereby the number of production steps can be reduced. Furthermore, as the material contained in the mask 30' and the sidewall formation film, a material which provides a high etching selectivity (e.g. $SiO_2$) with respect to the semiconductor layer (e.g. SiC layer) 2 may be used, in which case neither of the above etch-stop layers needs to be formed, so that the production steps can be more simplified.

In the present specification, the "semiconductor device" may be any that includes at least one element which is formed by using a semiconductor layer, and broadly encompasses semiconductor elements such as vertical MOSFETs and insulated gate bipolar transistors (IGBTs), as well as any device incorporating such a semiconductor element, for example. The semiconductor layer is not particularly limited, but may be Si or GaAs, or a wide-band gap semiconductor whose band gap is larger than theirs, e.g., SiC or GaN.

Note that it would be particularly advantageous to employ an SiC layer as the semiconductor layer. In a fabrication process for a semiconductor device in which an SiC layer is employed, the diffusion speed of impurity atoms within SiC is very small. In order to form a deep pn junction within the SiC semiconductor layer, it is necessary to perform an ion implantation with a high energy by using a relatively thick implantation mask when implanting an impurity into the SiC layer. Therefore, lowering of the controllability of photolithography due to the thickness of the implantation mask will become particularly problematic. However, according to the present invention, while ensuring the thickness of the implantation mask when implanting an impurity into the SiC layer, it is possible to greatly improve the controllability of the subsequent photolithography.

First Embodiment

Hereinafter, with reference to the drawings, a first embodiment of the present invention will be described. Herein, a method of producing an n channel type vertical power MOSFET composed of a plurality of unit cells by using an SiC semiconductor will be described.

FIGS. 2(a) to (k) are step-by-step cross-sectional views for describing a production method for the vertical MOSFET of the present embodiment.

First, as shown in FIG. 2(a), after a thin-film layer 80 is formed on the surface of an SiC layer 2 which has been grown on an SiC substrate (not shown), a mask 50 is provided on the thin-film layer 80. The thin-film layer 80 is an $SiO_2$ film having a thickness of 70 nm, for example. The mask 50 has a multilayer structure, including a lower layer (thickness: about 0.8 μm) 52 which is formed by using poly-Si and an upper layer (thickness: about 0.7 μm) 54 which is formed by using $SiO_2$, and functions as an implantation mask for well region formation.

As the SiC substrate, for example, a 4H—SiC substrate is used whose principal face has an off-angle of 8 degrees from (0001) in the [11-20] (1 1 2 bar 0) direction, having a diameter of 76 mm. This SiC substrate has the n type conductivity, and a carrier concentration of $7\times10^{18}$ cm$^{-3}$. The SiC layer 2 can be formed via epitaxial growth on the substrate, while an in-situ doping of an n type impurity (which herein is nitrogen) is performed by using CVD technique. The SiC layer 2 has a thickness of about 15 μm, and an impurity (nitrogen) concentration of about $5\times10^{15}$ cm$^{-3}$. Note that, between the SiC substrate and the SiC layer 2, an SiC layer containing an impurity at a higher concentration than in the SiC layer 2 may be formed as a buffer layer. Moreover, the thin-film layer 80 is obtained through thermal oxidation of known SiC.

The mask 50 can be formed by, after depositing a poly-Si film and an $SiO_2$ film (not shown) in this order on the thin-film layer 80, patterning these films through known photolithography and etching. At this time, since the thin-film layer 80 provided between the poly-Si film for forming the lower layer 52 of the mask 50 and the SiC layer 2 has a smaller etching rate than that of the poly-Si film, it is possible to prevent the SiC layer 2 from being eroded or the surface of the SiC layer 2 from being damaged during the etching of the mask 50. Therefore, an increase in channel resistance due to damaging of the SiC layer 2 can be suppressed.

The resultant mask 50 has apertures which define regions of the SiC layer 2 to become well regions. In the present embodiment, the thickness (a total thickness of the upper layer 54 and the lower layer 52) $t_1$ of the mask 50 is 1.5 µm. Note that it is preferable to set the thickness $t_1$ so as to be sufficiently greater than the projected range of the impurity. For example, in the case where the mask 50 is composed of the upper layer ($SiO_2$) 54 and the lower layer (poly-Si) 52; the well regions 6 have a depth of 0.6 µm; and the maximum implantation energy for well region formation is 350 keV as will be described later, the preferable thickness $t_1$ of the mask 50 is e.g. about 1.2 µm or more. The thickness $t_1$ is to be appropriately selected based on the material composing the mask 50, the implantation energy for forming the well regions 6, and the like. However, since the projected range of ions is approximately equal in $SiO_2$ and in poly-Si, a similar thickness $t_1$ will be used in the case where the mask 50 is composed only of $SiO_2$ or composed only of poly-Si, for example.

Next, as shown in FIG. 2(b), p type impurity ions are implanted into the SiC layer 2 from above the implantation mask 50. As a result, p type well regions (depth d: e.g. 0.6 µm) 6 having an average impurity concentration of $2 \times 10^{18}$ $cm^{-3}$ are formed in the regions of the SiC layer 2 where impurity ions have been implanted. Moreover, the remaining region of the SiC layer 2 where impurity ions have not been implanted becomes an n type drift region 2a.

In the present embodiment, Al ions are used as the p type impurity ions. Herein, the implantation of Al ions is performed at a plurality of energy levels, e.g., 30 keV, 60 keV, 120 keV, 200 keV, and 350 keV, and at a high temperature of 500° C., for example. A semiconductor material such as SiC has a small impurity diffusion coefficient, and therefore requires an implantation at a plurality of energy levels as mentioned above, and the depth d of the well regions 6 is determined by the implantation depth of Al ions in the SiC layer 2. Therefore, the energy at the time of implantation is appropriately selected in accordance with the depth d of the well regions 6 to be formed. Moreover, in order to prevent deterioration in crystallinity of the SiC layer due to ion implantation, it is preferable to perform the implantation at a high temperature of about 500° C.

Note that the depth d of the well regions 6 is preferably at least about 0.4 µm or more in order to suppress a punch-through in an OFF state of the resultant MOSFET. In this case, the preferable thickness of the mask 50 composed of $SiO_2$ and poly-Si is about 0.8 µm or more, which corresponds to twice the depth of the well regions 6. More preferably, the depth of the well regions 6 is 0.6 µm or more. In this case, the preferable thickness of the mask 50 composed of $SiO_2$ and poly-Si is about 1.2 µm or more.

Next, as shown in FIG. 2(c), the upper layer 54 of the mask 50 is removed by using dilute hydrofluoric acid, thus obtaining a mask 50' which is composed only of the lower layer 52. The thickness $t_2$ of the mask 50' is equal to the thickness of the lower layer 52, i.e., 0.8 µm. A preferable range for the thickness $t_2$ of the mask 50' will now be described. For example, when performing a photolithography using an i-line stepper, the substrate has a margin of about 0.8 µm along the thickness direction. Therefore, in order to enhance the photolithography precision and realize miniaturization of the cell pitch (cell pitch: e.g. 10 µm or less), it is preferable that the thickness $t_2$ of the mask 50' is 0.8 µm or less. On the other hand, since the mask 50' is used as an implantation mask at a step of forming the source regions 8 described later, the mask 50' needs to be sufficiently thicker than the projected range in the mask 50' during the implantation for source region formation. For example, in the case where the mask 50' is made of poly-Si; the source regions 8 has a depth of 0.25 µm; and the maximum implantation energy for source region formation is 90 keV as will be described later, the preferable thickness $t_2$ of the mask 50' is about 0.5 µm or more. Although the thickness $t_2$ is to be appropriately selected based on the material composing the mask 50', the implantation energy for forming the source regions 8, and the like, the projected range of ions is approximately equal in $SiO_2$ and poly-Si, and therefore a similar thickness $t_2$ is used also in the case where the mask 50' is made of $SiO_2$. Furthermore, in order to achieve good formation of the sidewalls of the mask 50' in a subsequent step, it is preferable that the thickness of the mask 50' is equal to or greater than the width of the sidewalls, i.e., the gate length Lg. Therefore, in the case where the depth of the source regions is designed to be 0.25 µm and the gate length Lg designed to be 0.5 µm, for example, it is preferable that the thickness of the mask 50' is selected from the range of no less than 0.5 µm but less than 0.8 µm.

Thereafter, as shown in FIG. 2(d), a thin-film layer 81 and a sidewall formation film 56 are deposited on the substrate surface so as to cover the implantation mask 50'. In the present embodiment, for example, after depositing an $SiO_2$ film having a thickness of 0.1 µm as the thin-film layer 81, a poly-Si film (thickness: 0.5 µm) is deposited as the sidewall formation film 56. The gate length Lg of the MOSFET is determined based on the thickness of the sidewall formation film 56. Note that, in an etching step for the sidewall formation film 56 described later, the thin-film layer 81 functions as an etch-stopper layer.

Next, as shown in FIG. 2(e), a resist film 58a is formed on the sidewall formation film 56. In the present embodiment, a difference ($h_1$-$h_2$) between the thickness $h_1$ of any portion of the resist film 58a that is located above a well region 6 and the thickness h2 of any portion that is located above the mask 50' is substantially equal to the thickness $t_2$ of the mask 50', i.e., 0.8 µm.

Figure 10:
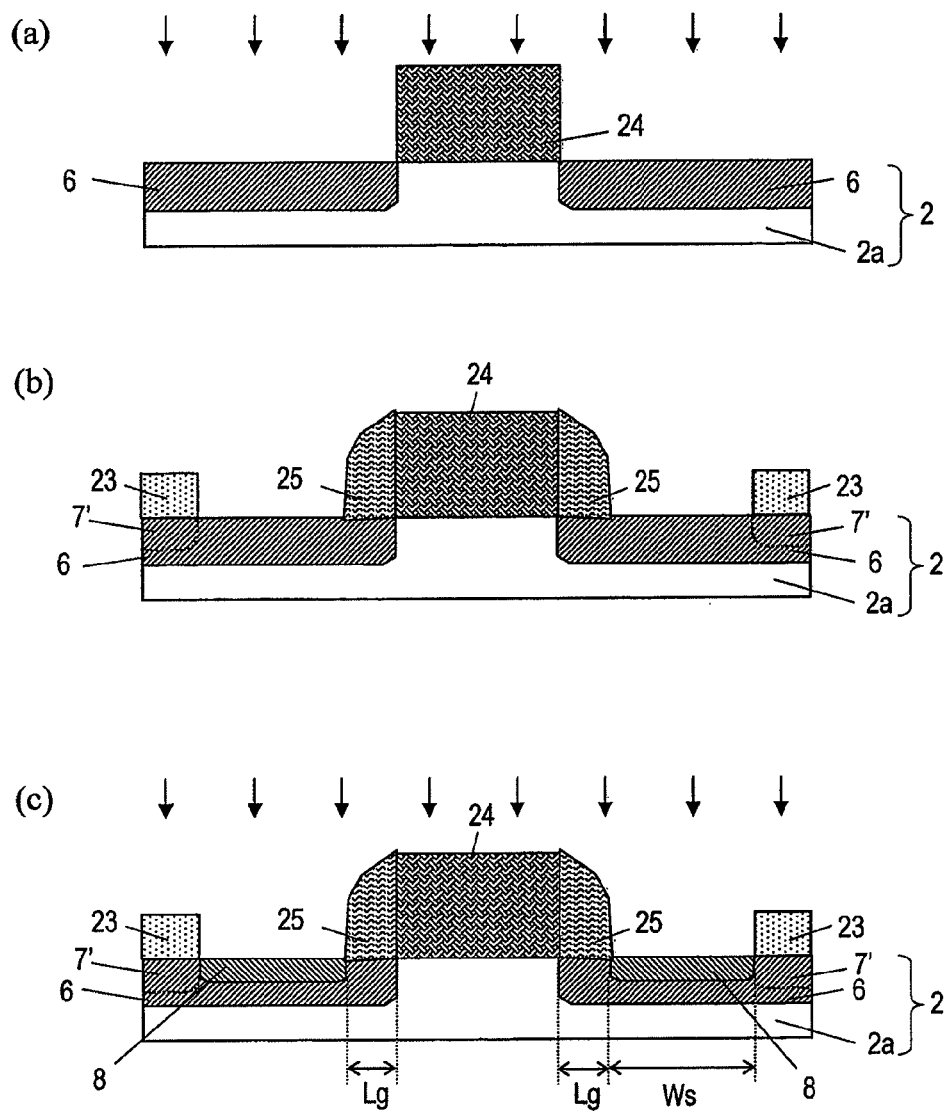
FIG. 10 (a) to (c) are step-by-step cross-sectional views for describing a method of forming source regions within well regions by using a conventional self-aligning process.

Next, as shown in FIG. 2(f), the resist film 58a is patterned through a known photolithography using an i-line stepper, for example, thus obtaining a resist layer 58 which covers a region of each well region 6 that becomes a $p^+$ type well contact region. In this case, the difference ($h_1$-$h_2$) in the thickness of the resist film 58a is 0.8 µm, which is greatly reduced relative to the difference (1.5 µm) in the thickness of the resist film in the conventional method which has been described with reference to FIG. 10. Thus, the thickness $h_1$ of the resist film 58a can be made thinner than conventionally, so that patterning of the resist film 58a can be performed with a higher precision than conventionally, whereby a resist layer 58 having a pattern which is substantially as designed can be formed.

Thereafter, as shown in FIG. 2(g), a dry etching for the sidewall formation film 56 and the resist layer 58 is performed, thus forming sidewalls 56a on the lateral walls of the mask 50', and also forming a mask (a mask for protecting the well contact regions) 56b that covers regions to become the well contact regions. At this time, since the thin-film layer 81 whose etching rate is smaller than that of the sidewall formation film 56 is provided between the SiC layer 2 and the sidewall formation film 56, it is possible to prevent the SiC layer 2 from being eroded or the surface of the SiC layer 2 from being damaged during the etching of the sidewall formation film 56.

As described above, the thickness of the mask 50' is preferably equal to or greater than the thickness (0.5 μm) of the sidewall formation film 56, whereby the sidewalls 56a can be formed in good shape. The thickness of the mask 56b is about the same as the gate length Lg which is determined by the thickness of the sidewall formation film 56, or slightly greater than the gate length Lg. Together with the mask 50', the resultant sidewalls 56a and mask 56b function as an implantation mask for source region formation. By forming the mask 56b, in a subsequent implantation step for source region formation, it is ensured that nitrogen is not implanted into the well contact regions 7 described later. As a result, high-concentration p type well contact regions 7 are obtained in the ion implantation for well contact region formation described later, so that good well contacts are formed.

Figure 3:
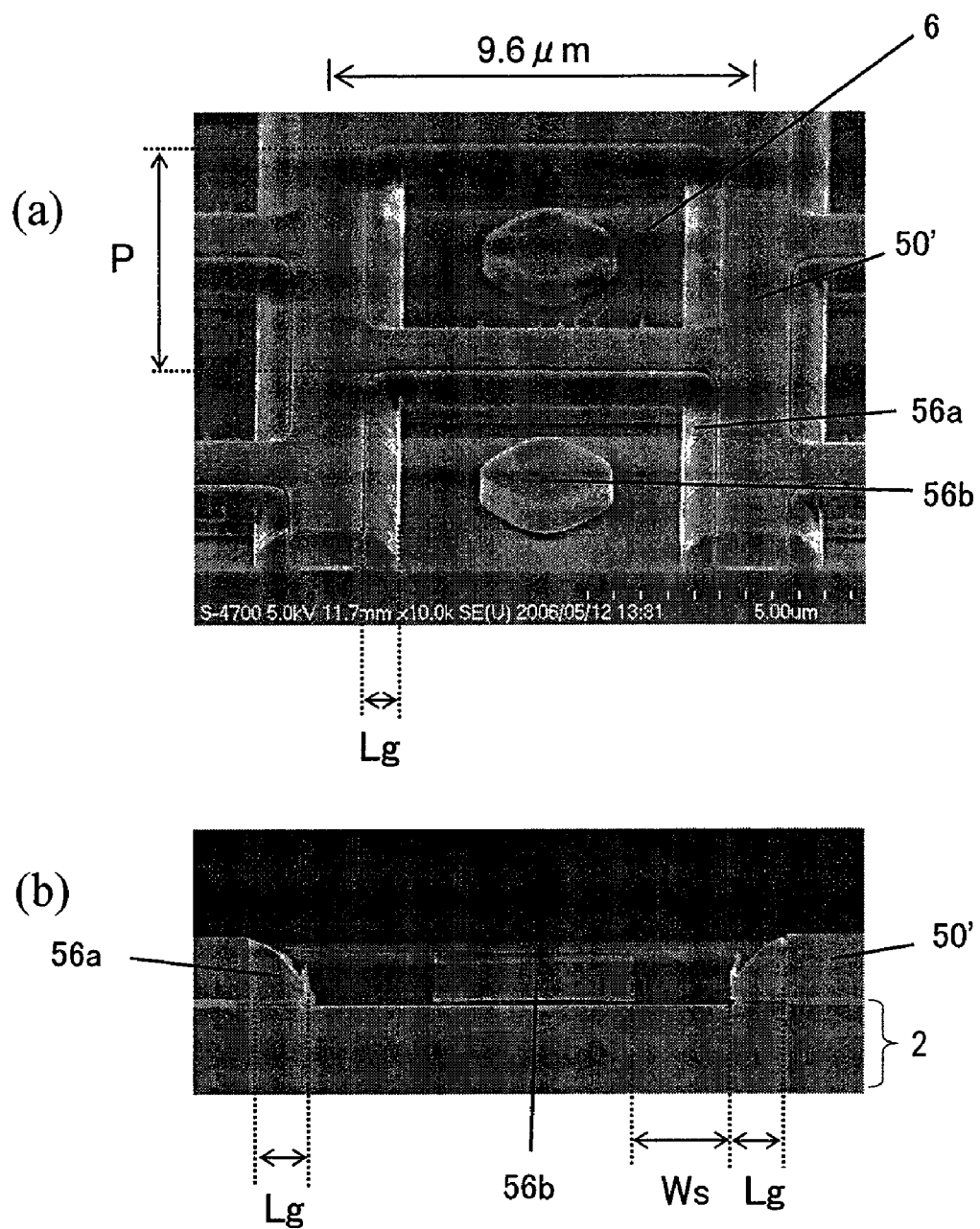
FIGS. 3 (a) and (b) are SEM photographs showing an upper face and a cross section of an implantation mask for forming source regions according to the first embodiment.

FIGS. 3(a) and (b) are SEM photographs respectively illustrating a surface and a cross section of the SiC layer 2 according to the present embodiment, on which the implantation mask for source region formation (mask 50', sidewalls 56a, and mask 56b) has been formed. In this example, well regions 6 are arranged which are substantially square (6.6 μm×6.6 μm) as seen from above the SiC layer 2, such that the size of a unit cell that is defined by each well region 6 is 9.6 Mm×9.6 μm. Moreover, the width Ws of a source region is about 1.3 μm. As can be seen from the SEM photographs, the mask 50' and the sidewalls 56a which are provided on the lateral walls on both sides thereof are provided so that they surround each region to become a source region. In the center of each region to become a source region, the mask 56b covering the region to become a well contact region is formed. Herein, the mask 56b is designed so as to have a substantially square planar shape, with each side constituting an angle of about 45° C.with respect to the directions in which the sidewalls 56a extend. As shown in the figures, the mask shape does not appear to be running at the edges of the mask 56b due to development residues, and thus the mask 56b is formed with a high precision. It can thus be seen that, even if the width Ws of the source regions is reduced to 1.8 μm or less and the arraying pitch (cell pitch) of unit cells is miniaturized to 10 μm or less (or 9.6 μm in this example), an implantation mask for source region formation can be formed with an excellent shape precision. It can also be confirmed that the width Lg of the sidewalls 56a is substantially uniform, so that a substantially uniform gate length is realized. Note that the "cell pitch" refers to an arraying pitch of the unit cells 100 along the column direction or the row direction, and is typically equal to an arraying pitch P of the well regions 6 along the column direction or the row direction.

By implanting n type impurity ions into the SiC layer 2 by using the aforementioned implantation mask for source region formation, as shown in FIG. 2(h), n type source regions (depth: 0.25 μm) 8 having an average impurity concentration of $5\times10^{19}$ cm$^{-3}$ are formed inside the well regions 6. In the present embodiment, nitrogen ions are used as the n type impurity ions. Herein, the implantation of the nitrogen ions is performed at a plurality of energy levels such as 30 keV, 50 keV, 90 keV, for example, and is performed at a high temperature of e.g. 500° C. As mentioned earlier, a semiconductor material such as SiC has a small impurity diffusion coefficient, and therefore requires an impurity implantation to be performed at a plurality of energy levels. In this case, the depth of the source regions 8 is determined by the implantation depth of nitrogen ions in the SiC layer 2. Therefore, the energy at the time of implantation is to be appropriately selected according to the depth of the source regions 8 to be formed. Moreover, in order to prevent deterioration in crystallinity of the SiC layer due to ion implantation, it is preferable to perform the implantation at a high temperature of about 500° C. Since the implantation mask for source region formation does not have any slopes, the source regions 8 are obtained in good shape without slopes. Note that the width of the source regions 8 is 1.3 μm, and the distance (gate length of the MOSFET) Lg between the end of a source region 8 and the end of a well region 6 on the surface of the SiC layer 2 is defined by the width of the sidewalls 56a, i.e., the thickness of the sidewall formation film 56, which is 0.5 μm herein.

Next, as shown in FIG. 2(i), the mask 50', the sidewalls 56a, the mask 56b, and the thin-film layers 80 and 81 are removed through a wet etching employing nitric-hydrofluoric acid and dilute hydrofluoric acid, for example, and thereafter an SiO$_2$ film is formed on the surface of the SiC layer 2, which is patterned to provide an implantation mask 60 for well contact region formation. The implantation mask 60 has apertures which define regions of the well regions 6 in which well contact regions are to be formed.

Thereafter, as shown in FIG. 2(j), p type impurity ions (e.g. Al ions) are implanted into the SiC layer 2 through multiple steps by using the implantation mask 60, whereby p$^+$ type well contact regions 7 having an average impurity concentration $5\times10^{19}$ cm$^{-3}$ are obtained. Herein, since no implantation was performed for the well contact regions 7 at the ion implantation step for source region formation, high-concentration p$^+$ type well contact regions 7 can be obtained. Thereafter, the implantation mask 60 is removed.

Next, in order to activate the impurity ions which have been implanted into the SiC layer 2, an activation annealing is performed at a temperature of no less than 1500° C. and no more than 1800° C., for example. After the annealing, the impurity concentration of the well regions 6 is $2\times10^{18}$ cm$^{-3}$; the impurity concentration of the source regions 8 is $5\times10^{19}$ Cm$^{-3}$; and the impurity concentration of the well contact regions 7 is $5\times10^{19}$ cm$^{-3}$. However, in the case of not performing the channel layer formation which is described later, in order to control the threshold value, it is preferable that the impurity concentration near a face of each well region 6 that is in contact with a gate insulating film is lower (e.g. impurity concentration: about $1\times10^{17}$ cm$^{-3}$) than that in any other portion.

Next, as shown in FIG. 2(k), by known methods, a channel layer 3, a gate oxide film 4, a gate electrode 11, source electrodes 10, and a drain electrode (not shown) are formed, thus obtaining a vertical MOSFET.

The channel layer 3 can be formed by epitaxially growing SiC on the entire surface of the SiC layer 2 while performing an impurity (nitrogen) in-situ doping by using a CVD technique, and patterning the resultant SiC growth layer. It suffices if the channel layer 3 is formed at least in the surface region of the well regions 6 spanning between the drift region 2a and the source regions 8. Moreover, it is preferable that no channel layer 3 is formed in the region of the surface of the SiC layer 2 where the source electrodes are to be formed. The channel layer 3 has a thickness of about 0.2 μm and an average impurity concentration of about $1\times10^{17}$ cm$^{-3}$. When the channel layer 3 is formed by epitaxial growth, the surface planarity of the channel portion can be improved, thus resulting in an advantage in that the channel mobility can be improved and control of the threshold value is facilitated.

The gate oxide film 4 is formed by subjecting the surface of the channel layer 3 to thermal oxidation, and has a thickness of about 0.07 μm. Since an oxide film is formed also on the rear face of the substrate in this thermal oxidation step, this oxide film is removed after the thermal oxidation step. The gate electrode 11 can be formed by depositing a poly-Si film on the surface of the gate insulating film 4 and patterning it. As shown in the figure, the gate insulating film 4 and the gate electrode 11 cover an extent from the source region 8 within one well region 6 to the source region 8 within an adjoining well region 6, astride the drift region 2a between the well regions.

Each source electrode 10 forms an ohmic junction with a source region 8 and a well contact region 7. Such source electrodes 10 are obtained by forming a titanium metal layer so as to be in contact with the source regions 8 and with the well contact regions 7, and thereafter performing a heat treatment at about 950° C.

Although not shown, the gate electrode 11 is covered by an interlayer insulating film ($SiO_2$ film). The formation of the interlayer insulating film may be performed after formation of the source electrodes 10. Alternatively, after an interlayer insulating film is formed, source electrodes 10 may be provided by the above method in contact holes which are formed in the interlayer insulating film. In either case, the source electrodes 10 are connected to upper wiring (not shown) via contact holes which are formed in the interlayer insulating film.

Moreover, although not shown, the drain electrode can be formed by depositing a titanium metal layer on the substrate rear face and performing a heat treatment similar to that when forming the source electrodes 10.

According to the above method, by thinning the mask 50, the level differences of the substrate surface which becomes an underlayer of the resist film 58a are reduced, thereby making it possible to reduce the thickness $h_1$ at portions of the resist film 58a located above the well regions 6. Therefore, it becomes possible to transfer a fine resist pattern through an exposure-development step of the resist film 58a. Thus, the cell size does not need to be increased so as to account for the precision of photolithography, and it is possible to downsize the unit cells. As a result, the degree of channel integration is improved, whereby the channel resistance can be reduced. Moreover, since the above method employs a self-aligning process to form the source regions 8, the gate length Lg can be made uniform and short, thus making it possible to further reduce the channel resistance.

In the present embodiment, the implantation mask for well region formation (mask 50) has a multilayer structure, and after performing an implantation for forming the well regions, at least one layer is removed from the uppermost of the multilayer structure, whereby the thickness of the mask 50 is reduced. Therefore, the thickness of the mask 50 can be easily reduced by choosing the etching conditions, and the thickness of the mask 50' having a reduced thickness can be controlled more accurately. Note that the structure of the mask 50 is not limited to a two-layer structure, but may be a multilayer structure of three layers or more. Moreover, it is preferable that the mask 50 includes at least two layers containing respectively different materials, which makes it possible to remove only some of the layers from the uppermost of the multilayer structure based on etching conditions such as the etchant. For example, if the mask 50 has a structure in which an $SiO_2$ layer is stacked on a poly-Si layer, the overlying $SiO_2$ layer can be selectively etched through an etching using dilute hydrofluoric acid. Conversely, if it has a structure in which a poly-Si layer is stacked on an $SiO_2$ layer, the overlying poly-Si layer can be selectively etched through an etching using nitric-hydrofluoric acid. Note that, the construction of the mask 50 such as the number of layers, the materials, thicknesses, and the like of the respective layers are not particularly limited, but may be appropriately selected.

Hereinafter, the construction of the vertical MOSFET of the present embodiment will be described in detail.

Figure 4:
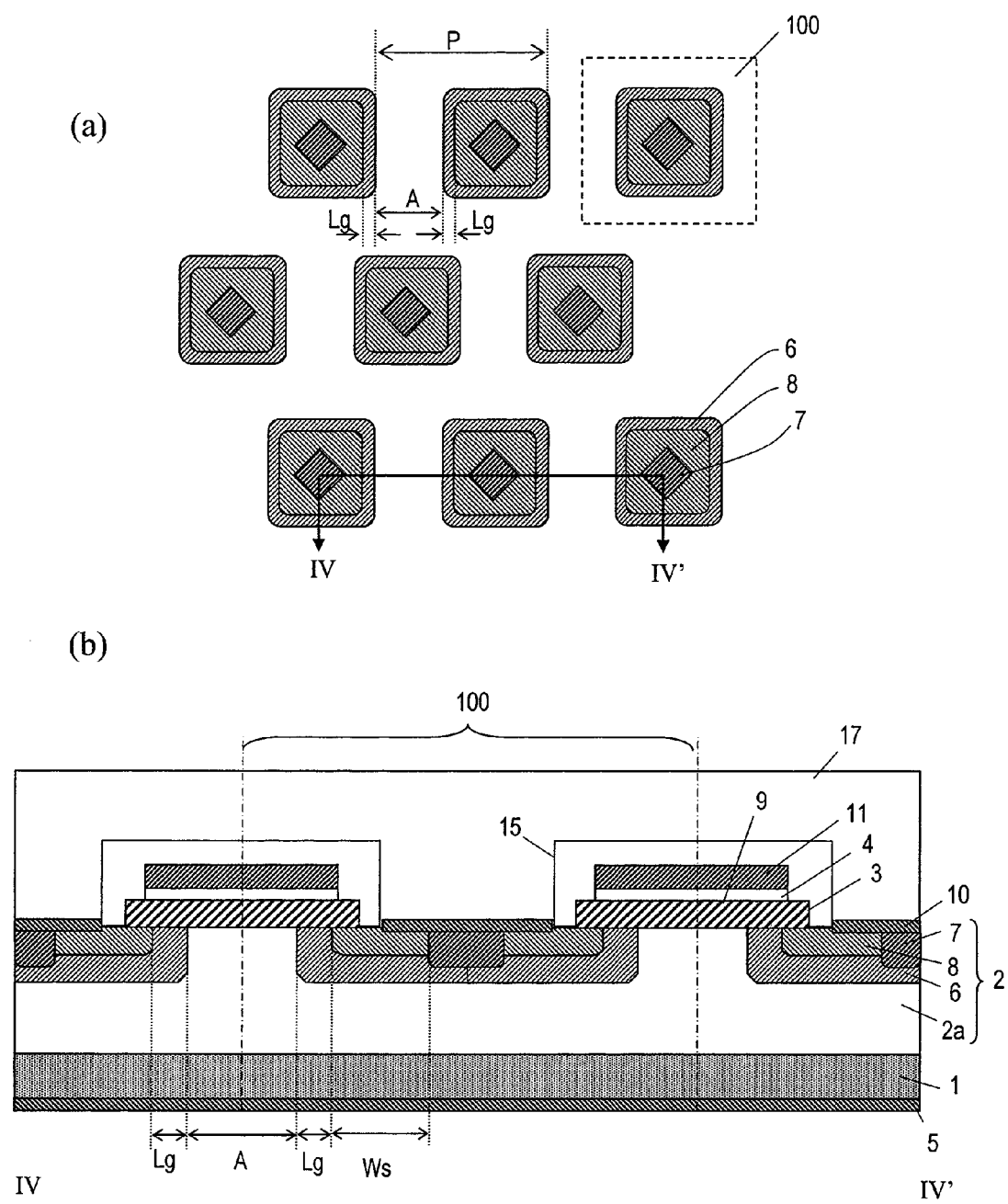
FIGS. 4 (a) and (b) are diagrams showing a vertical MOSFET according to the first embodiment of the present invention, where: (a) is an upper plan view of an SiC layer of the vertical MOSFET; and (b) is an enlarged cross-sectional view of the vertical MOSFET along line IV-IV' shown in (a).

FIGS. 4(a) and (b) are diagrams exemplifying a vertical MOSFET which is obtained by the method having been described with reference to FIGS. 2(a) to (k), where (a) is an upper plan view of the SiC layer 2, and (b) is an enlarged cross-sectional view along line IV-IV' of the vertical MOSFET.

As shown in FIG. 4(a), the vertical MOSFET has a structure in which square-shaped unit cells 100 being centered around the well regions 6 are integrated. The arraying pitch of the unit cell 100 is similar to the arraying pitch P of the well regions. Herein, the well regions 6 are arranged with a pitch P of 9.6 μm along the row direction, and are disposed so that every row is shifted by a ½ pitch along the row direction. As viewed from a direction perpendicular to the SiC layer 2, each well region 6 is a square, one side of which is about 6.6 μm, and the distance A between adjoining well regions 6 is about 3 μm. Moreover, the width Ws of each source region 8 is 1.3 μm. The gate length Lg, i.e., the distance between the end of a well region 6 and the end of a source region 8, is substantially uniform and is about 0.5 μm.

Next, a cross-sectional shape of the vertical MOSFET will be described. As shown in FIG. 4(b), the SiC layer 2 formed on the SiC substrate 1 includes the drift region 2a, the p type well regions 6, the source regions 8, and the well contact regions 7. The lower face (the face which is in contact with the drift region 2a) of each well region 6 is at a depth of about 0.6 μm, and the lower face (the face which is in contact with a well region 6) of each source region 8 is at a depth of about 0.25 μm. Moreover, the channel layer 3 is formed between adjoining well regions 6 on the surface of the SiC layer 2. The gate electrode 11 is provided on the channel layer 3 via the gate oxide film 4. The gate electrode 11 is covered with an interlayer insulating film 15. Moreover, the source regions 8 and the well contact regions 7 are electrically connected with the source electrodes 10, which are provided on the SiC layer 2. Through contact holes which are formed in the interlayer insulating film 15, the source electrodes 10 are electrically connected to upper wiring 17 which is provided on the interlayer insulating film 15. On the other hand, a drain electrode 5 is provided on the rear face of the SiC substrate 1.

In the present embodiment, the gate length Lg of the vertical MOSFET is substantially uniform because it is defined through a self-aligning process, and is 1 μm or less, and more preferably 0.8 μm or less. Moreover, the well regions 6 have a sufficient depth because they are formed by using the relatively thick implantation mask 50. The depth of the well regions 6 is e.g. 0.4 μm or more, and preferably 0.6 μm or more. Furthermore, by enhancing the precision of the photolithography which is performed after forming the well regions 6, the unit cells 100 are reduced in size, such that the arraying pitch of the unit cell 100, i.e., the arraying pitch P of the well regions 6, is 10 μm or less.

Next, an operation of the vertical MOSFET of the present embodiment will be described. When a voltage is applied to the gate electrode 11, electrons are attracted in between the channel layer 3 and the gate insulating film 4, so that carriers are generated in regions (channel regions) 9 of the surface of the channel layer 3 that are located between the gate electrode 11 and the well regions 6, thus establishing an ON state (normally-off type). In other words, electrons become capable of moving from the source regions 8, through the channel regions 9 and the drift region 2a, into the drain electrode 5. Therefore, a drain current flows inside the SiC layer 2 in a vertical direction through the drift region 2a, the channel regions 9, and the source regions 8, to the source electrodes 10.

On the other hand, when the potential of the gate electrode 11 is set to the ground level (OFF state), no current flows in the channel regions 9, and therefore the drain current is zero. Note that a drain voltage Vd is applied to the drain electrode 5 in an OFF state, as a result of which depletion layers extend from adjoining well regions 6 to the drift region 2a. Thus, the gate insulating film 4 is prevented from deteriorating by being exposed to a high electric field based on the drain voltage Vd. Note that the aforementioned drain voltage Vd is determined according to the circuit in which the semiconductor device is employed, so that the potential difference between the source electrodes 10 and the drain electrode 5 is 1400 V, for example.

The interval A between the well regions 6 needs to be designed so that depletion layers which are formed respectively from adjoining well regions 6 due to the drain voltage Vd are combined in a state where the drain voltage Vd is applied to the drain electrode 5 when the gate voltage is OFF, thus depleting the entire extent of the drift region 2a between adjoining well regions 6, but that the depletion layers which are formed respectively from adjoining well regions 6 are not combined when the gate voltage is applied. Note that the manners in which the depletion layers extend at pn junctions will change depending on the impurity concentration in the drift region 2a, so that the interval A between the well regions 6 is to be appropriately selected according to the impurity concentration in the drift region 2a.

Next, an ON resistance of the MOSFET of the present embodiment will be described in detail.

The ON resistance of an MOSFET can be considered as a series combination of the resistance of the source regions 8 (source resistance), the resistance of the channel regions 9 (channel resistance), the resistance of the drift region 2a (drift resistance), and the resistance of the substrate 1 (substrate resistance). Among these, the source resistance can be reduced to a negligible level by miniaturizing the unit cells 100, and the substrate resistance is uniquely determined based on the substrate 1 used. Therefore, a large part of the ON resistance is ascribable to the drift resistance and the channel resistance. Note that, when a layer of a compound semiconductor material is used as the semiconductor layer composing an MOSFET, the proportion ascribable to the channel resistance will increase because of a lower channel mobility than the mobility in a bulk state. Among others, in an MOSFET in which a wide-band gap semiconductor material having a high breakdown field (band gap: 2 eV or more) is used, an even greater proportion of the ON resistance will be ascribable to the channel resistance, because the drift resistance can be reduced by allowing the drift region to be a thinner film and to have a higher concentration. Since the present embodiment employs SiC, which is a wide-band gap semiconductor, the drift resistance can be lowered. However, due to a large amount of interface states occurring at the interface between the SiC layer 2 and $SiO_2$ (gate insulating film) 4 which is obtained through thermal oxidation of SiC, the channel mobility will become much lower than the mobility in a bulk state, whereby the channel resistance is increased. Therefore, since a particularly large proportion of the ON resistance is ascribable to the channel resistance, the ON resistance of the MOSFET can be effectively reduced by reducing the channel resistance.

In the MOSFET shown in FIGS. 4(a) and (b), the gate length Lg is short (1 µm or less) as described above, so that the channel resistance in each unit cell 100 is reduced. Furthermore, due to miniaturization of the unit cells 100 (arraying pitch: 10 µm or less), the channel integration density of the MOSFET is high, so that the channel resistance of the entire MOSFET is lower. Thus, by reduction of the gate length Lg and miniaturization of the unit cells 100, the channel resistance of the MOSFET is reduced, as a result of which the ON resistance of the MOSFET is greatly lowered than conventionally. Specifically, the ON resistance of this MOSFET is lowered to 7 $m\Omega cm^2$, which is about 10% lower than the ON resistance of a vertical MOSFET whose unit cell size is 11.6 µm and whose gate length is 1 µm.

The channel layer 3 of the present embodiment may be a single epitaxial layer, or have a multilayer structure with different impurity concentrations, but the impurity density of the channel layer 3 is preferably selected so that substantial depletion occurs when the potential difference between the gate electrode 11 and the source electrodes 10 is zero volts.

Although the channel layer 3 in the present embodiment is an epitaxial channel layer which is formed via epitaxial growth, an implantation channel layer may instead be formed through ion implantation into the SiC layer 2. Alternatively, without forming the channel layer 3, a channel (inversion layer) may be formed in the surface region of each well regions 6 between the drift region 2a and the source region 8 by applying a gate voltage.

Although the above-described vertical MOSFET is composed of a unit cell 100 having a square planar shape, the vertical MOSFET of the present embodiment may be composed of unit cells having other shapes. Such a vertical MOSFET construction will be described below.

Figure 5:
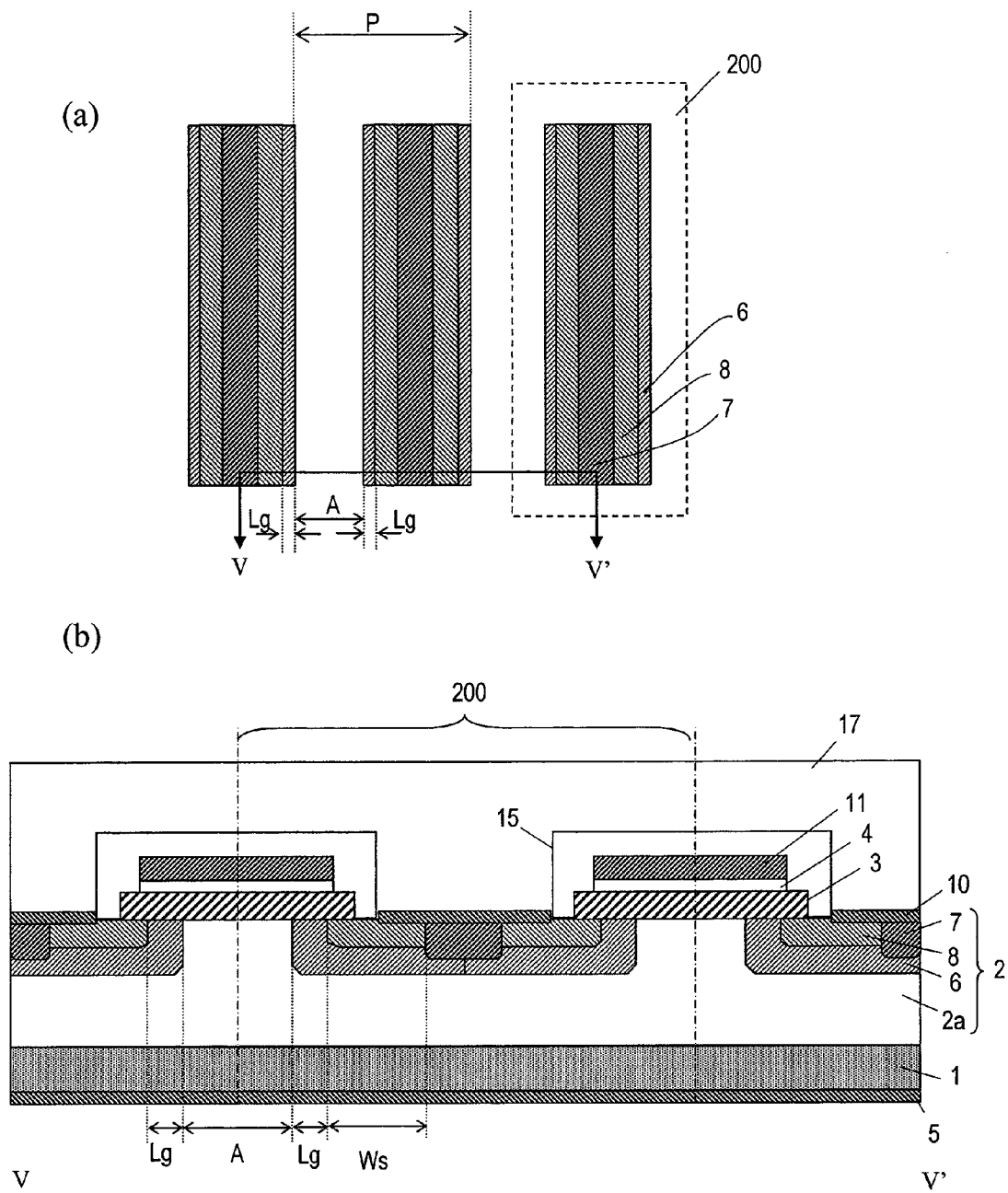
FIGS. 5 (a) and (b) are diagrams showing another vertical MOSFET according to the first embodiment of the present invention, where: (a) is an upper plan view of an SiC layer of the vertical MOSFET; and (b) is an enlarged cross-sectional view of the vertical MOSFET along line V-V' shown in (a).

FIGS. 5(a) and (b) are diagrams exemplifying another vertical MOSFET of the present embodiment, where: (a) is an upper plan view of the SiC layer 2; and (b) is an enlarged cross-sectional view of the vertical MOSFET along line V-V'. For simplicity, constituent elements which are similar to those in FIGS. 4(a) and (b) will be denoted by like reference numerals, and the descriptions thereof will be omitted.

As shown in FIG. 5(a), in this example, stripe-shaped unit cells 200 extending in a specific direction are arranged in a direction perpendicular to the specific direction. The arraying pitch of the unit cells 200, i.e., the arraying pitch P of the well regions 6, is 10 µm or less. The cross-sectional structure of the unit cell 200 shown in FIG. 5(b) is similar to the structure which has been described with reference to FIG. 4(b). This vertical MOSFET is also produced by the method which has been described with reference to FIGS. 2(a) to (k), and therefore provides an effect of reducing the ON resistance similar to the above.

Second Embodiment

Hereinafter, with reference to the drawings, a second embodiment of the present invention will be described. Herein, a method for producing a vertical power MOSFET having the above-described construction will be described with reference to FIG. 4 or FIG. 5. The present embodiment differs from the earlier-described embodiment in that a single-layered mask is used as an implantation mask for well region formation, instead of a mask having a multilayer structure.

FIGS. 6(a) to (e) are step-by-step cross-sectional views for describing a production method for the vertical MOSFET of the present embodiment. For simplicity, constituent elements which are similar to those in FIGS. 2(a) to (k) will be denoted by like reference numerals, and the descriptions thereof will be omitted.

Figure 6:
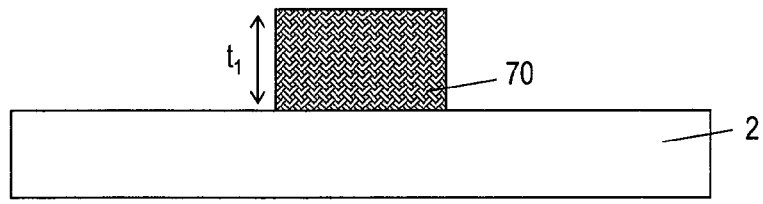
FIG. 6 (a) to (e) are step-by-step cross-sectional views for describing a method for producing a vertical MOSFET according to a second embodiment of the present invention.
Figure 6:
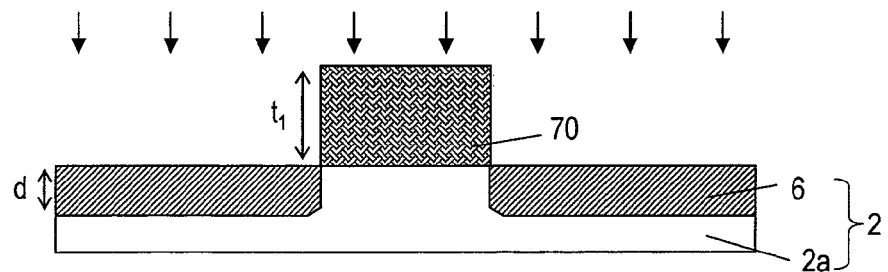
Figure 6:
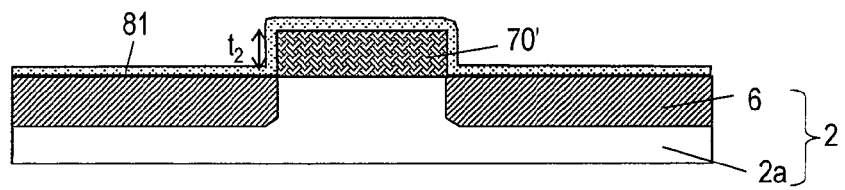
Figure 6:
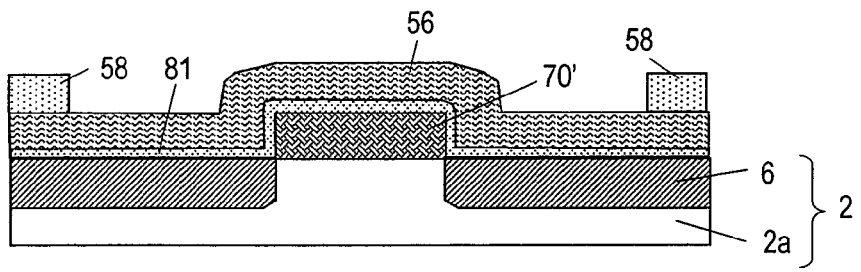
Figure 6:
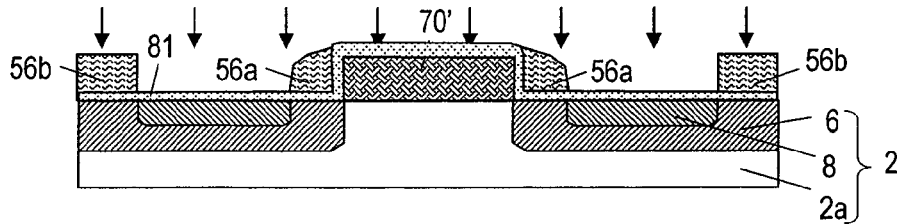

First, as shown in FIG. 6(a), a mask 70 is provided as an implantation mask for well region formation on an SiC layer 2, which is grown on the surface of an SiC substrate (not shown). For example, the mask 70 is an SiO$_2$ layer which is obtained by depositing an SiO$_2$ film on the SiC layer 2 and patterning it. The mask 70 has apertures defining regions of the SiC layer 2 to become well regions, and has a thickness t$_1$ of about 1.5 μm. Note that the material of the mask 70 is not limited to SiO$_2$, but may be poly-Si. Moreover, a preferable range for the thickness t$_1$ of the mask 70 is similar to the preferable range for the thickness of the mask 50 in the earlier-described embodiment.

Next, as shown in FIG. 6(b), by implanting p type impurity ions (Al ions) into the SiC layer 2 by using the mask 70, well regions (depth d: e.g. 0.6 μm) 6 are formed. The region of the SiC layer 2 where impurity ions have not been implanted becomes a drift region 2a. The implantation method and implantation conditions for the impurity ions are similar to those in the method which has been described with reference to FIG. 2(b).

Thereafter, as shown in FIG. 6(c), only an upper portion of the mask 70 is removed by an appropriate method such as anisotropic etching, thereby obtaining a mask 70' which is thinner than the mask 70. At this time, the thickness of the mask 70' can be controlled by adjusting the etching time. The thickness of the mask 70' is 0.8 μm, for example. Note that the preferable range for the thickness of the mask 70' is similar to the preferable range for the thickness of the implantation mask 30' in the earlier-described embodiment.

Next, as shown in FIG. 6(d), a thin-film layer 81 and a sidewall formation film (e.g. a poly-Si film) 56, which function as etch-stop layers, are deposited in this order so as to cover the mask 70', and thereafter a resist layer 58 is formed on the sidewall formation film 56. In the present embodiment, an SiO$_2$ film is used as the thin-film layer 81. The thicknesses and formation methods of the thin-film layer 81, the sidewall formation film 56, and the resist layer 58a are similar to the thicknesses and formation methods described above with reference to FIGS. 2(d) to (f).

Thereafter, as shown in FIG. 6(e), sidewalls 56a are formed on the lateral walls of the mask 70' through a dry etching of the sidewall formation film 56 and the resist layer 58, thus forming a mask 56b which covers the regions to become well contact regions. Next, by using the mask 70', the sidewalls 56a, and the mask 56b as an implantation mask, n type impurity ions (nitrogen ions) are implanted into the SiC layer 2, thereby forming n type source regions (depth: e.g. 0.25 μm) 8 are formed inside the well regions 6. The implantation method and implantation conditions for forming the source regions 8 are similar to the implantation method and implantation conditions which have been described above with reference to FIG. 2(h).

Although the subsequent steps are not illustrated in the figures, by a method similar to the method described above with reference to FIGS. 2(i) to (k), p$^+$ type well contact regions, a channel layer, a gate oxide film, a gate electrode, source electrodes, a drain electrode, and the like are formed, thus obtaining a vertical MOSFET.

According to the above method, as in the earlier-described embodiment, the gate length Lg can be reduced and the degree of integration of unit cells can be enhanced, whereby the ON resistance of the MOSFET can be effectively reduced.

Third Embodiment

Hereinafter, with reference to the drawings, a third embodiment of the present invention will be described. Herein, a method for producing a vertical power MOSFET having the construction described above with reference to FIG. 4 or FIG. 5 will be described. In the present embodiment, as in the first embodiment, a mask having a multilayer structure is used as an implantation mask for well region formation. However, the materials of the respective layers composing the mask are different from those of the first embodiment.

FIGS. 7(a) to (k) are step-by-step cross-sectional views for describing a production method for the vertical MOSFET of the present embodiment. For simplicity, constituent elements which are similar to those in FIGS. 2(a) to (k) will be denoted by like reference numerals, and the descriptions thereof will be omitted.

Figure 7:
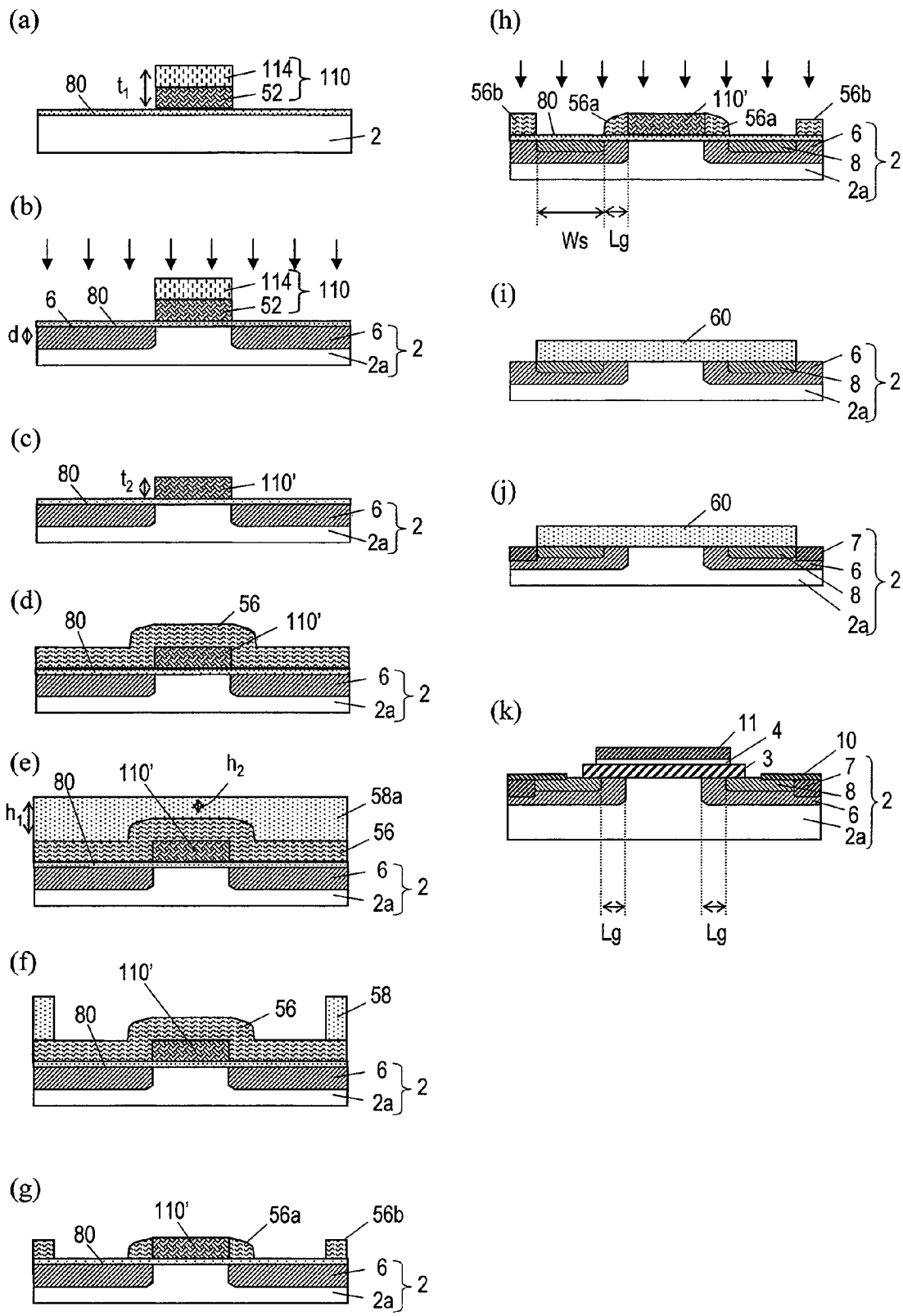
FIG. 7 (a) to (k) are schematic step-by-step cross-sectional views for describing a method for producing a vertical MOSFET according to a third embodiment of the present invention.

First, as shown in FIG. 7(a), a thin-film layer 80 functioning as an etch-stop layer and a mask 110 functioning as an implantation mask for well region formation are provided on an SiC layer 2 which is grown on the surface of an SiC substrate (not shown). For example, the thin-film layer 80 is an SiO$_2$ film, and is obtained through thermal oxidation of SiC. The mask 110 has a multilayer structure including a lower layer (thickness: about 0.8 μm) 52 formed by using poly-Si and an upper layer (thickness: about 0.7 μm) 114 formed by using silicon nitride (SiN), for example, and functions as an implantation mask for well region formation.

The mask 110 can be formed by sequentially depositing a poly-Si film and an SiN film (not shown) on the thin-film layer 80, and thereafter patterning these films by using known photolithography and etching. Since these films are formed on the SiC layer 2 via the thin-film layer 80, it is possible to suppress erosion of the SiC layer 2 or damaging of the surface of the SiC layer 2 during patterning as compared to the case where they are formed directly on the SiC layer 2, thus being able to protect the surface of the SiC layer 2.

Next, as shown in FIG. 7(b), p type impurity ions are implanted into the SiC layer 2 from above the implantation mask 110. The implantation method and implantation conditions for the impurity ions are similar to those in the method of the first embodiment described above with reference to FIG. 2(b).

Next, as shown in FIG. 7(c), the upper layer 114 of the mask 110 is removed by using a chemical solution containing phosphoric acid, for example, thus obtaining a mask 110' which is composed only of the lower layer 52. The thickness t$_2$ of the mask 110' is equal to the thickness of the lower layer 52, i.e. 0.8 μm. Moreover, since the thin-film layer 80 is not etched by the aforementioned chemical solution, at least a portion of the thin-film layer 80 remains on the surface of the SiC layer 2. At a subsequent step shown in FIG. 7(g), the thin-film layer 80 will function as an etch-stop layer when etching the sidewall formation film 56.

Thereafter, as shown in FIG. 7(d), a sidewall formation film 56 is deposited on the substrate surface so as to cover the implantation mask 110'. In the present embodiment, a poly-Si film (thickness: 0.5 μm) is deposited as the sidewall formation film 56. The gate length Lg of the MOSFET is determined based on the thickness of the sidewall formation film 56.

In the steps shown in FIGS. 7(e) to (k), through a method similar to the method which has been described above with reference to FIGS. 2(e) to (k), source regions, p$^+$ type well contact regions, a channel layer, a gate oxide film, a gate electrode, source electrodes, a drain electrode, and the like are formed, thus obtaining a vertical MOSFET.

In the present embodiment, at the step shown in FIG. 7(c), the materials and etchants of the upper layer 114 and the thin-film layer 80 are selected so that only the upper layer 114 of the mask 110 is selectively removed but that the thin-film layer 80 is not removed. Moreover, the lower layer 52 and the sidewall formation film 56 contain the same material (poly-Si). Therefore, the thin-film layer 80, which functioned as an etch-stop layer when forming the mask 110, can also be utilized as an etch-stop layer when forming the sidewalls 56a. In the method of the first embodiment described with reference to FIG. 2, two steps need to be performed to form the thin-film layers 80 and 81 to become etch-stop layers. However, the present embodiment permits an omission down to one step of forming a thin-film layer, which is advantageous.

Moreover, according to the above method, as in the earlier-described embodiments, the gate length Lg can be reduced and also the degree of integration of unit cells can be enhanced, whereby the ON resistance of the MOSFET can be effectively reduced.

Fourth Embodiment

Hereinafter, with reference to the drawings, a fourth embodiment of the present invention will be described. Herein, a method for producing a vertical power MOSFET having the construction described above with reference to FIG. 4 or FIG. 5 will be described. In the present embodiment, as in the first and third embodiments, a mask having a multi-layer structure is used as an implantation mask for well region formation. However, the materials of the respective layers composing the mask are different from those of these embodiments.

FIGS. 8(a) to (k) are step-by-step cross-sectional views for describing a production method for the vertical MOSFET of the present embodiment. For simplicity, constituent elements which are similar to those in FIGS. 2(a) to (k) will be denoted by like reference numerals, and the descriptions thereof will be omitted.

Figure 8:
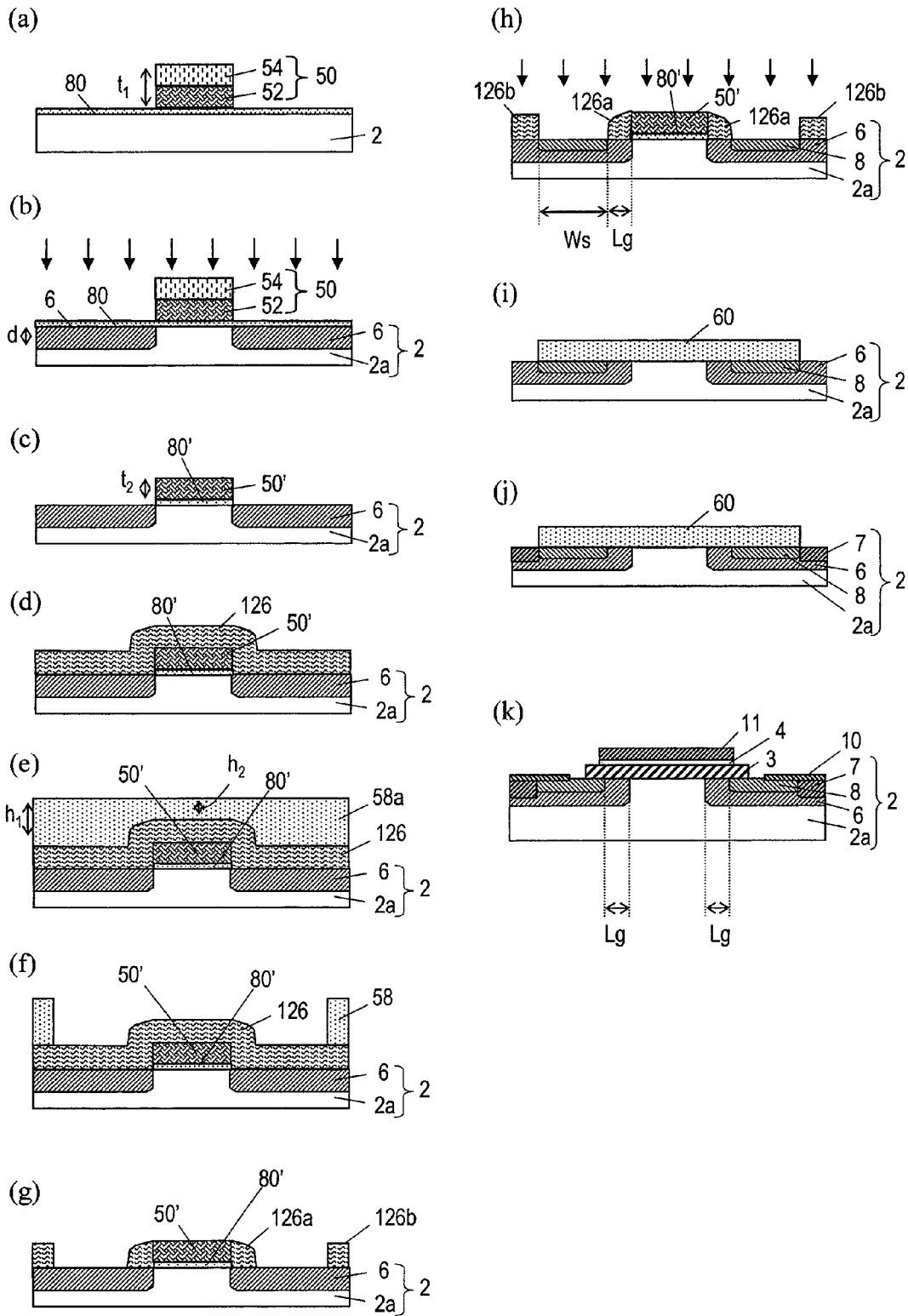
FIG. 8 (a) to (k) are schematic step-by-step cross-sectional views for describing a method for producing a vertical MOSFET according to a fourth embodiment of the present invention.

First, as shown in FIG. 8(a), a thin-film layer 80 functioning as an etch-stop layer and a mask 50 functioning as an implantation mask for well region formation are provided on an SiC layer 2 which is grown on the surface of an SiC substrate (not shown). For example, the thin-film layer 80 is an $SiO_2$ film, and is obtained through thermal oxidation of SiC. The mask 50 has a multilayer structure including a lower layer (thickness: about 0.8 μm) formed by using poly-Si and an upper layer (thickness: about 0.7 μm) 54 formed by using $SiO_2$, for example, and functions as an implantation mask for well region formation.

The mask 50 can be formed by sequentially depositing a poly-Si film and an $SiO_2$ film (not shown) on the thin-film layer 80, and thereafter patterning these films by using known photolithography and etching. Since these films are formed on the SiC layer 2 via the thin-film layer 80, it is possible to suppress erosion of the SiC layer 2 and damaging of the surface of the SiC layer 2 during patterning as compared to the case where they are formed directly on the SiC layer 2, thus being able to protect the surface of the SiC layer 2.

Next, as shown in FIG. 8(b), p type impurity ions are implanted into the SiC layer 2 from above the implantation mask 50. The implantation method and implantation conditions for the impurity ions are similar to those in the method of the first embodiment described above with reference to FIG. 2(b).

Next, as shown in FIG. 8(c), the upper layer 54 of the mask 50 is removed by using a chemical solution containing dilute hydrofluoric acid, for example, thus obtaining a mask 50' which is composed only of the lower layer 52. The thickness $t_2$ of the mask 50' is equal to the thickness of the lower layer 52, i.e., 0.8 μm.

Thereafter, as shown in FIG. 8(d), a sidewall formation film 126 is deposited on the substrate surface so as to cover the implantation mask 50'. In the present embodiment, an $SiO_2$ film (thickness: 0.5 μm) is deposited as the sidewall formation film 126. The gate length Lg of the MOSFET is determined based on the thickness of the sidewall formation film 126.

In the steps shown in FIGS. 8(e) to (k), through a method similar to the method which has been described above with reference to FIGS. 2(e) to (k), source regions, $p^+$ type well contact regions, a channel layer, a gate oxide film, a gate electrode, source electrodes, a drain electrode, and the like are formed, thus obtaining a vertical MOSFET.

Figure 2:
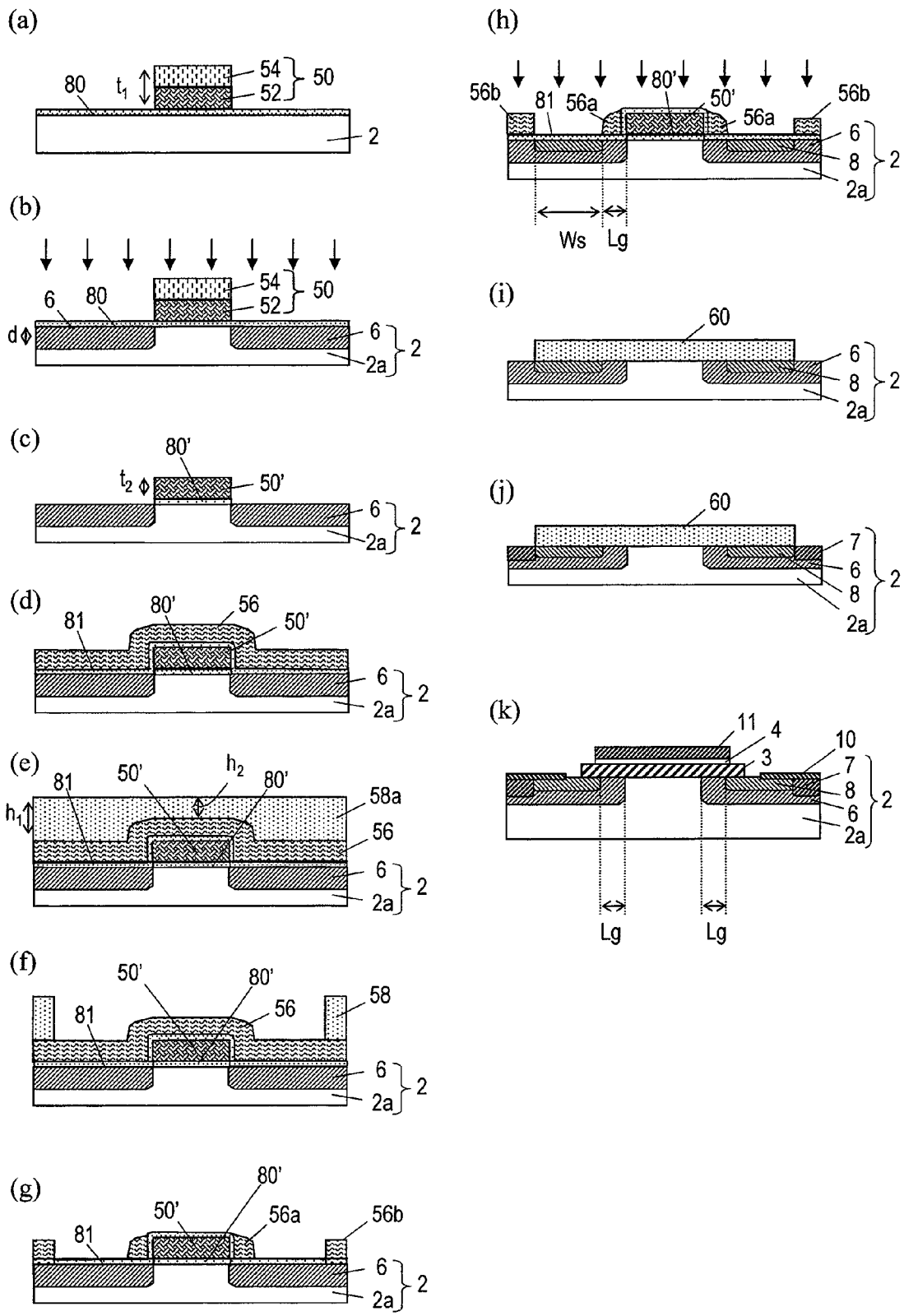
FIG. 2 (a) to (k) are schematic step-by-step cross-sectional views for describing a method for producing a vertical MOSFET according to a first embodiment of the present invention.

In the present embodiment, since an $SiO_2$ film is used as the sidewall formation film 126, the etching selectivity of the sidewall formation film 126 relative to the SiC layer 2 and the mask 50' can be enhanced. As a result, in the etching step of the sidewall formation film 126 shown in FIG. 8(g), erosion of the SiC layer 2 can be prevented even if a thin-film layer 81 as shown in FIG. 2(g) is not formed between the SiC layer 2 and the sidewall formation film 126. In the method of the first embodiment described with reference to FIG. 2, two steps need to be performed to form the thin-film layers to become etch-stop layers. However, the present embodiment permits an omission down to one step of forming a thin-film layer, which is advantageous.

Moreover, according to the above method, as in the earlier-described embodiments, the gate length Lg can be reduced and also the degree of integration of unit cells can be enhanced, whereby the ON resistance of the MOSFET can be effectively reduced.

Fifth Embodiment

Hereinafter, with reference to the drawings, a fifth embodiment of the present invention will be described. Herein, a method for producing a vertical power MOSFET having the construction described above with reference to FIG. 4 or FIG. 5 will be described. In the present embodiment, as in the first, third, and fourth embodiments, a mask having a multilayer structure is used as an implantation mask for well region formation. However, the materials of the respective layers composing the mask are different from those of these embodiments.

FIGS. 9(a) to (k) are step-by-step cross-sectional views for describing a production method for the vertical MOSFET of the present embodiment. For simplicity, constituent elements which are similar to those in FIGS. 2(a) to (k) will be denoted by like reference numerals, and the descriptions thereof will be omitted.

Figure 9:
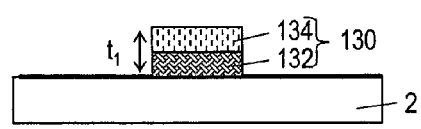
FIG. 9 (a) to (k) are schematic step-by-step cross-sectional views for describing a method for producing a vertical MOSFET according to a fifth embodiment of the present invention.
Figure 9:
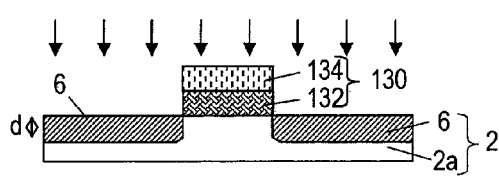
Figure 9:
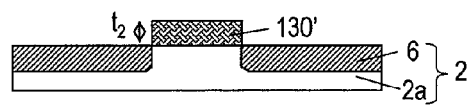
Figure 9:
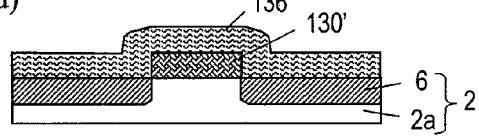
Figure 9:
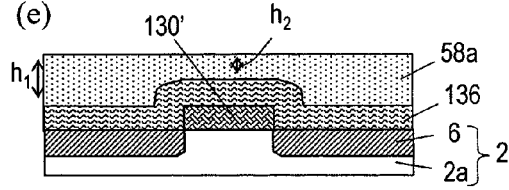
Figure 9:
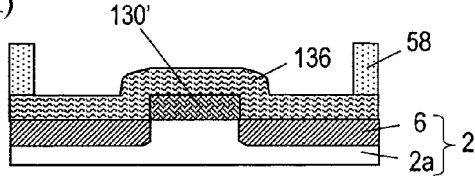
Figure 9:
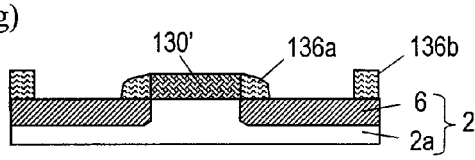
Figure 9:
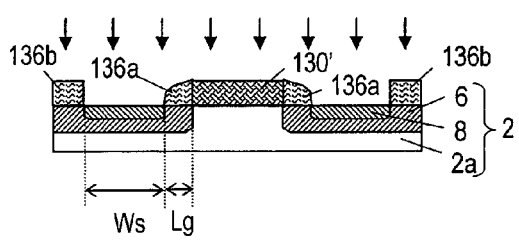
Figure 9:
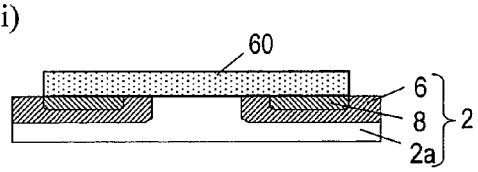
Figure 9:
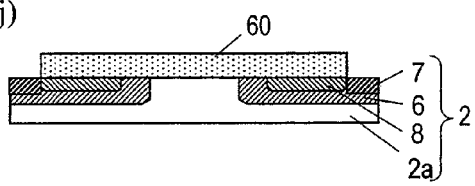
Figure 9:
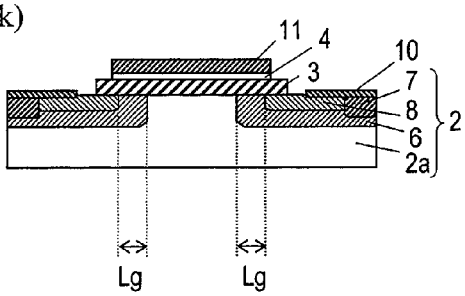

First, as shown in FIG. 9(a), a mask 130 is provided as an implantation mask for well region formation on an SiC layer 2 which is grown on the surface of an SiC substrate (not shown). For example, the mask 130 has a multilayer structure including a lower layer (thickness: about 0.8 μm) 132 formed by using $SiO_2$ and an upper layer (thickness: about 0.7 μm) 134 formed by using poly-Si, and functions as an implantation mask for well region formation.

The mask 130 can be formed by sequentially depositing an $SiO_2$ film and a poly-Si film (not shown) on the SiC layer 2, and thereafter patterning these films by using known photolithography and etching. In the present embodiment, since the etching selectivity between the $SiO_2$ film and the SiC layer 2 is high, the SiC layer 2 can be prevented from being eroded when etching the $SiO_2$ film. Therefore, there is not need to form any thin-film layer (etch-stop layer) for protecting the surface of the SiC layer 2 before forming the mask 130, so that a step of forming a thin-film layer can be omitted.

Next, as shown in FIG. 9(b), p type impurity ions are implanted into the SiC layer 2 from above the implantation mask 130. The implantation method and implantation conditions for the impurity ions are similar to those in the method of the first embodiment described above with reference to FIG. 2(b).

Next, as shown in FIG. 9(c), the upper layer 134 of the mask 130 is removed by using a chemical solution containing nitric-hydrofluoric acid, for example, thereby obtaining a mask 130' which is composed only of the lower layer 132. The thickness $t_2$ of the mask 130' is equal to the thickness of the lower layer 132, i.e., 0.8 μm.

Thereafter, as shown in FIG. 9(d), a sidewall formation film 136 is deposited on the substrate surface so as to cover the implantation mask 130'. In the present embodiment, an $SiO_2$ film (thickness: 0.5 μm) is deposited as the sidewall formation film 136. The gate length Lg of the MOSFET is determined based on the thickness of the sidewall formation film 136. In the present embodiment, since an $SiO_2$ film is used as the sidewall formation film 136, a high etching selectivity relative to the SiC layer 2 and the mask 130' is obtained. Therefore, even if no thin-film layer (etch-stop layer) is formed between the SiC layer 2 and the sidewall formation film 136, the SiC layer 2 can be prevented from being eroded when etching the sidewall formation film 136.

In the steps shown in FIGS. 9(e) to (k), through a method similar to the method which has been described above with reference to FIGS. 2(e) to (k), source regions, $p^+$ type well contact regions, a channel layer, a gate oxide film, a gate electrode, source electrodes, a drain electrode, and the like are formed, thus obtaining a vertical MOSFET.

In the method of the first embodiment described with reference to FIG. 2, it is necessary to perform two steps of forming thin-film layers to become etch-stop layers. However, according to the present embodiment, since a material which provides a high etching selectivity relative to the SiC layer 2 is used as the material of the lower layer 132 of the mask 130 and the sidewall formation film 136, a step of forming a thin-film layer can be omitted, thus being able to simplify the production steps.

Moreover, according to the above method, as in the earlier-described embodiments, the gate length Lg can be reduced and also the degree of integration of unit cells can be enhanced, whereby the ON resistance of the MOSFET can be effectively reduced.

The production method according to the present invention is not limited to the methods which have been described with reference to FIGS. 2(a) to (k), FIGS. 6(a) to (e), FIGS. 7(a) to (k), FIGS. 8(a) to (k), and FIGS. 9(a) to (k). Although these methods form a mask for protecting the well contact regions (mask 56b) from the sidewall formation film 56, it may also be possible to form a mask for protecting the well contact regions from a resist film, as in the method which has been described with reference to FIGS. 1(a) to (e).

Although the thin-film layers 80 and 81 are formed as etch-stop layers for mask formation and/or sidewall formation in the first to fourth embodiments above, these are not essential.

Although an offcut substrate whose principal face is the 4H—SiC (0001) plane is used as the SiC substrate 1 in the first to fifth embodiments above, an SiC substrate of any other polytype, e.g., 6H—SiC, 15R—SiC, or 3C—SiC, may be used. Also, the surface orientation, the offcut direction, and the like of the SiC substrate 1 are not limited to the surface orientation and the offcut direction in Embodiments 1 to 5. Moreover, instead of the SiC substrate 1, a semiconductor substrate composed of any semiconductor material other than SiC may be used.

Furthermore, although an MOSFET is produced by using an SiC substrate 1 of the same conductivity type as that of the SiC layer 2 in the above embodiments, an IGBT may instead be produced by using an SiC substrate of a different conductivity type from that of the SiC layer 2. Also in the case of producing an IGBT, as in the methods described in the above embodiments, the gate length Lg can be reduced and also the degree of integration of unit cells can be enhanced by reducing the thickness of an implantation mask after forming well regions and utilizing a self-aligning process, so that the ON resistance can be reduced.

INDUSTRIAL APPLICABILITY

According to the present invention, in a semiconductor device having a transistor including a plurality of unit cells, the degree of integration of unit cells can be enhanced by reducing the gate length and making the size of each unit cell smaller than conventionally, whereby the ON resistance can be effectively reduced. Therefore, a semiconductor device having small conduction losses than conventionally can be provided. Moreover, according to the present invention, such a semiconductor device can be produced through a simple process which is suitable for mass production.

The present invention is broadly applicable to vertical-type semiconductor elements such as vertical MOSFETs and IGBTs, as well as devices including such semiconductor elements, and power devices having a low power consumption are provided. In particular, applications to vertical MOSFETs which are formed by using SiC would be advantageous.

The invention claimed is:

1. A production method for a semiconductor device comprising the steps of:
   (a) providing a semiconductor substrate having a semiconductor layer of a first conductivity type formed on a surface thereof;
   (b) forming a first mask so as to cover a region of the semiconductor layer;
   (c) forming a well region of a second conductivity type by implanting impurity ions of the second conductivity type into the semiconductor layer having the first mask formed thereon;
   (d) reducing a thickness of the first mask by removing a portion of the first mask;
   (e) forming a second mask covering a portion of the well region by using photolithography; and
   (f) forming a source region of the first conductivity type by implanting impurity ions of the first conductivity type into the semiconductor layer having the first mask with the reduced thickness and the second mask formed thereon,
   the method further comprising, between step (d) and step (e),
   a step (h) of forming a sidewall formation film covering the first mask with the reduced thickness, wherein,
   step (e) includes
      a step (e1) of forming on the sidewall formation film a resist layer covering a portion of the well region, and
      a step (e2) of etching the sidewall formation film and the resist layer to form the second mask and the sidewall from the sidewall formation film; and
   step (f) is a step of forming the source region of the first conductivity type by implanting impurity ions of the first conductivity type into the semiconductor layer on which the second mask, the first mask with the reduced thickness, and the sidewall are formed.

2. The production method for a semiconductor device of claim 1, wherein, the first mask has a multilayer structure including a plurality of layers; and step (d) includes a step (d1) of reducing the thickness of the first mask by removing at least one layer from an uppermost of the multilayer structure.

3. The production method for a semiconductor device of claim 2, wherein the multilayer structure has at least two layers containing respectively different materials, and step (d1) includes a step of removing an upper layer of the at least two layers.

4. The production method for a semiconductor device of claim 3, wherein the at least two layers are a layer containing silicon dioxide and a layer containing polycrystalline silicon.

5. The production method for a semiconductor device of claim 2, further comprising, between step (a) and step (b), a step of forming an etch-stop layer on the semiconductor layer, wherein, in step (b), the first mask is formed on the etch-stop layer.

6. The production method for a semiconductor device of claim 5, wherein the etch-stop layer contains silicon dioxide and the first mask contains polycrystalline silicon.

7. The production method for a semiconductor device of claim 2, further comprising, between step (a) and step (h), a step of forming an etch-stop layer on the semiconductor layer, wherein, in step (h), the sidewall formation film is formed on the etch-stop layer.

8. The production method for a semiconductor device of claim 7, wherein the etch-stop layer contains silicon dioxide and the sidewall formation film contains polycrystalline silicon.

9. The production method for a semiconductor device of claim 2, wherein the first mask with the reduced thickness and the sidewall formation film contain a same material.

10. The production method for a semiconductor device of claim 2, wherein the thickness of the first mask is 0.8 µm or more.

11. The production method for a semiconductor device of claim 2, wherein the thickness of the first mask with the reduced thickness is 0.8 µm or less.

12. The production method for a semiconductor device of claim 2, wherein the thickness of the first mask with the reduced thickness is equal to or greater than a thickness of the sidewall formation film.

13. The production method for a semiconductor device of claim 2, wherein the semiconductor layer contains silicon carbide.

* * * * *

UNITED STATES PATENT AND TRADEMARK OFFICE
CERTIFICATE OF CORRECTION

| | | |
|---|---|---|
| PATENT NO. | : 7,981,817 B2 | Page 1 of 1 |
| APPLICATION NO. | : 12/523073 | |
| DATED | : July 19, 2011 | |
| INVENTOR(S) | : Koichi Hashimoto, Shin Hashimoto and Kyoko Egashira | |

It is certified that error appears in the above-identified patent and that said Letters Patent is hereby corrected as shown below:

Title Page, Item (57) Abstract, line 5, "(c)" should be deleted.

Signed and Sealed this
Seventh Day of February, 2012

David J. Kappos
*Director of the United States Patent and Trademark Office*